US012580027B2

(12) United States Patent
Sakurai et al.

(10) Patent No.: US 12,580,027 B2
(45) Date of Patent: Mar. 17, 2026

(54) SEMICONDUCTOR STORAGE DEVICE

(71) Applicant: Kioxia Corporation, Tokyo (JP)

(72) Inventors: Katsuaki Sakurai, Yokohama
Kanagawa (JP); Tooru Tategami,
Kawasaki Kanagawa (JP)

(73) Assignee: Kioxia Corporation, Tokyo (JP)

( * ) Notice: Subject to any disclaimer, the term of this
patent is extended or adjusted under 35
U.S.C. 154(b) by 242 days.

(21) Appl. No.: 18/460,496

(22) Filed: Sep. 1, 2023

(65) Prior Publication Data

US 2024/0096426 A1 Mar. 21, 2024

(30) Foreign Application Priority Data

Sep. 16, 2022 (JP) ................................. 2022-148491

(51) Int. Cl.
G11C 16/30 (2006.01)
G11C 16/08 (2006.01)

(52) U.S. Cl.
CPC .............. G11C 16/30 (2013.01); G11C 16/08
(2013.01)

(58) Field of Classification Search
CPC .......... G11C 16/30; G11C 16/28; G11C 16/04
See application file for complete search history.

(56) References Cited

U.S. PATENT DOCUMENTS 7,085,189 B2 8/2006 Horii et al.
9,443,600 B2 9/2016 Ghalam et al.

2004/0120204 A1 6/2004 Kanda
2011/0149673 A1 6/2011 Sim
2011/0173462 A1 7/2011 Wakrat et al.
2012/0063234 A1 3/2012 Shiga et al.
2012/0275226 A1* 11/2012 Nakamura ............. G11C 16/30
365/185.21
2015/0364161 A1 12/2015 Seo

FOREIGN PATENT DOCUMENTS

JP 2004-152405 A 5/2004
JP 2012-058860 A 3/2012

OTHER PUBLICATIONS

Japanese Office Action dated Jan. 20, 2026 in corresponding Japa-
nese Patent Application 2022-148491 with English Translation, 9
pages.

* cited by examiner

*Primary Examiner* — Jason Lappas
(74) *Attorney, Agent, or Firm* — Kim & Stewart LLP

(57) ABSTRACT

A semiconductor storage device includes a first region
including a level shifter, a second region including a level
shifter, a power input pad, and an internal power generation
circuit configured to generate an internal power supply
voltage using a first power supply voltage supplied through
the power input pad and supply the internal power supply
voltage to the first and second regions. The internal power
generation circuit separately transmits a first signal to the
level shifter of the first region for triggering a start of a first
operation of the first region and a second signal to the level
shifter of the second region for triggering a start of a second
operation of the second region.

20 Claims, 22 Drawing Sheets

VDDREADYn_C<0>

VDDREADYn_C<1>

VDDREADYn_C<2>

VDDREADYn_C<3>

SEMICONDUCTOR STORAGE DEVICE

CROSS-REFERENCE TO RELATED APPLICATION(S)

This application is based upon and claims the benefit of priority from Japanese Patent Application No. 2022-148491, filed Sep. 16, 2022, the entire contents of which are incorporated herein by reference.

FIELD

Embodiments described herein relate generally to a semiconductor storage device.

BACKGROUND

In recent years, NAND memories have become widely adopted as semiconductor storage devices. In such semiconductor storage devices, there is a need to reduce peak currents.

DESCRIPTION OF THE DRAWINGS

FIG. 2 is a block diagram illustrating a configuration example of a nonvolatile memory according to the embodiment.

FIG. 4 is a diagram illustrating an equivalent circuit of a block of a NAND memory cell array with a 3-dimensional structure in the nonvolatile memory according to the embodiment.

FIG. 10 is a circuit diagram illustrating an example of a circuit including a level shifter.

FIG. 14 is a diagram illustrating another usage example of the level shifter.

FIG. 16 is a diagram illustrating a peak of an ICC current according to the embodiment.

FIG. 17 is a block diagram according to a second embodiment.

FIG. 19 is a diagram illustrating a first group of memory chips at even chip addresses and a second group of memory chips at odd chip addresses.

Figure 23:
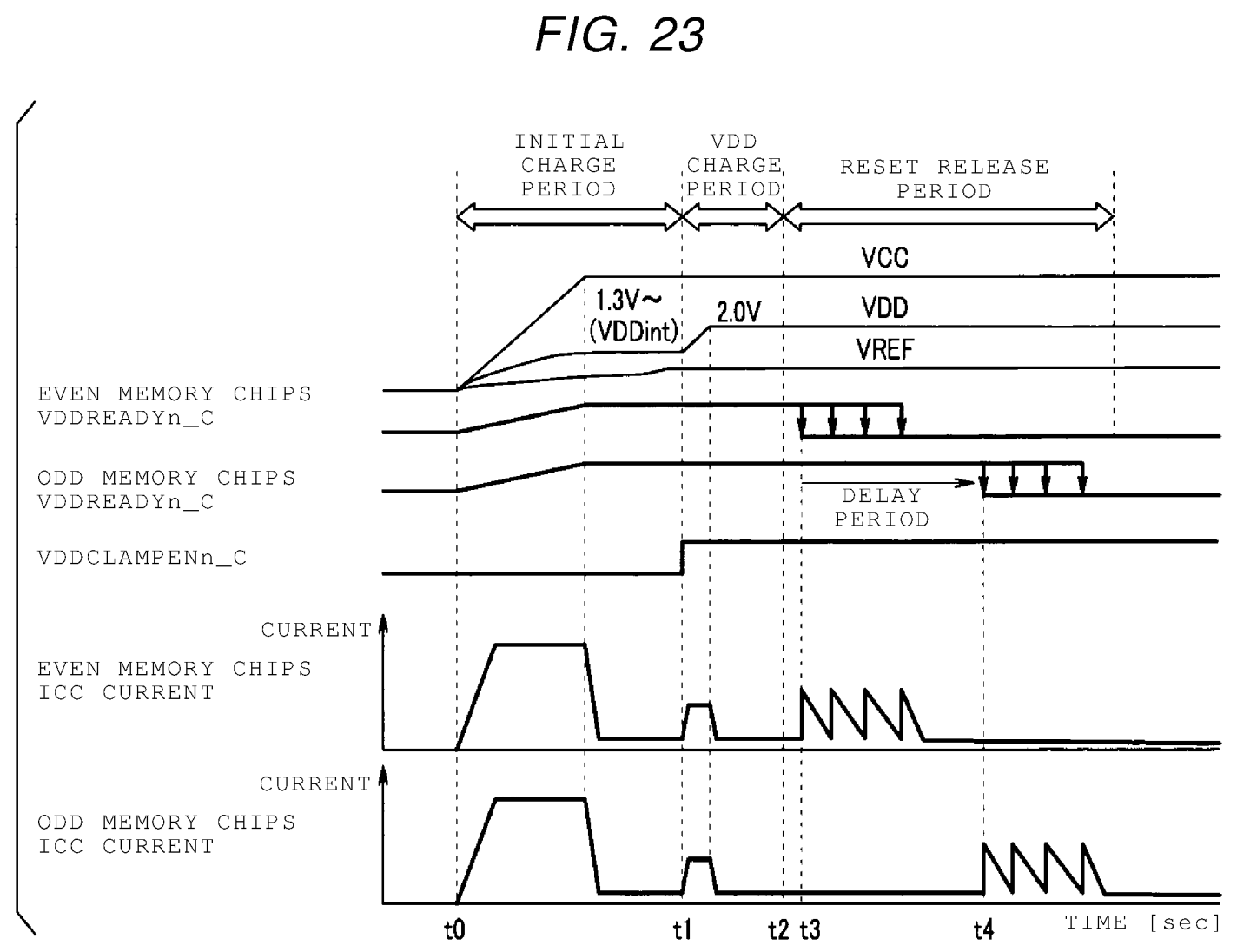

FIG. 23 is a diagram illustrating a peak of the ICC current according to the second embodiment.

FIG. 25 is a diagram illustrating a peak of an ICC current according to a modification of the embodiments.

DETAILED DESCRIPTION

Embodiments provide a semiconductor storage device capable of reducing a peak current.

In general, according to one embodiment, a semiconductor storage device includes a first region including a level shifter, a second region including a level shifter, a power input pad, and an internal power generation circuit configured to generate an internal power supply voltage using a first power supply voltage supplied through the power input pad and supply the internal power supply voltage to the first and second regions. The internal power generation circuit separately transmits a first signal to the level shifter of the first region for triggering a start of a first operation of the first region and a second signal to the level shifter of the second region for triggering a start of a second operation of the second region.

Hereinafter, embodiments will be described in detail with reference to the drawings.

First Embodiment

A peak current is reduced by adjusting an operation start timing.

Configuration of Memory System

Figure 1:
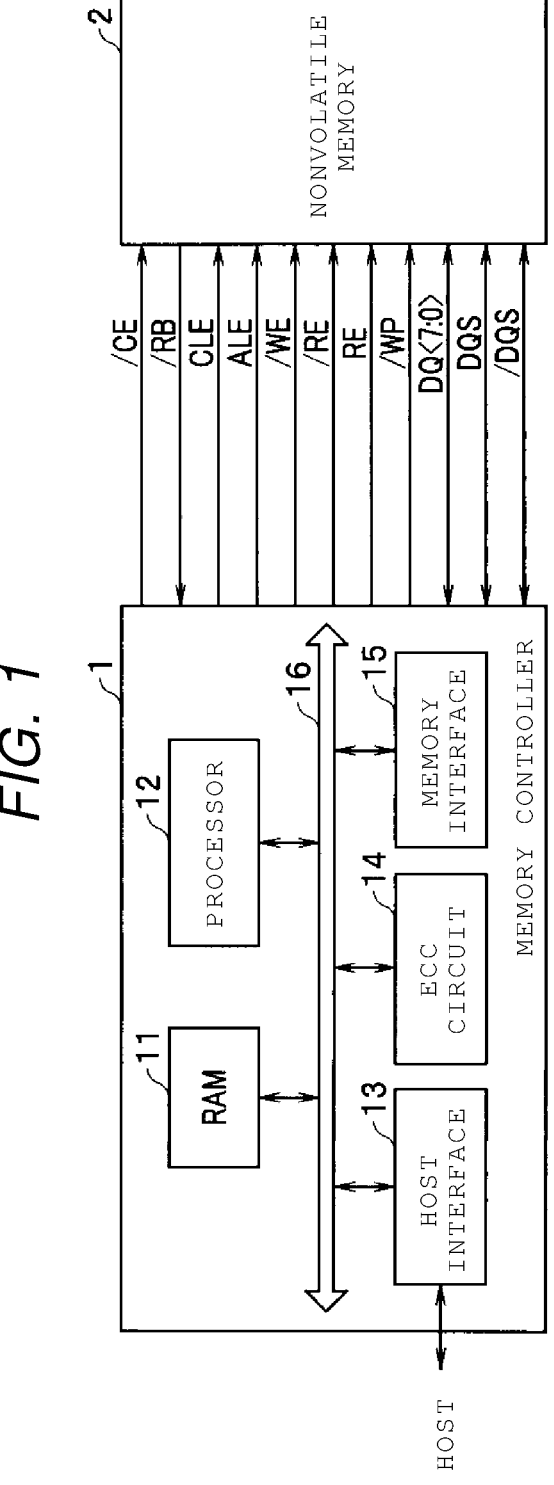
FIG. 1 is a block diagram illustrating a configuration example of a memory system according to an embodiment.

FIG. 1 is a block diagram illustrating a configuration example of a memory system according to the embodiment. The memory system according to the embodiment includes a memory controller 1 and a nonvolatile memory 2. The memory system can be connected to a host. The host is, for example, an electronic device such as a personal computer or a portable terminal.

The nonvolatile memory 2 is a semiconductor storage device that stores data in a nonvolatile manner and is configured with a NAND memory, for example. In the embodiment, the nonvolatile memory 2 will be described as a NAND memory that includes memory cell transistors capable of storing 3 bits per memory cell transistor, that is, a NAND memory of 3 bit/cell (triple level cell (TLC)), but the embodiment is not limited thereto. The nonvolatile memory 2 is a 3-dimensional memory.

The memory controller 1 controls writing of data in the nonvolatile memory 2 in response to a write request from the host. The memory controller 1 controls reading of data from the nonvolatile memory 2 in response to a read request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other via an internal bus 16.

The host interface 13 outputs a request received from the host, write data which is user data, or the like to the internal bus 16. The host interface 13 transmits user data read from the nonvolatile memory 2, a response from the processor 12, or the like to the host.

The memory interface 15 controls processes of writing and reading user data or the like in and from the nonvolatile memory 2 based on an instruction of the processor 12.

The processor 12 generally controls the memory controller 1. The processor 12 is, for example, a central processing unit (CPU), a micro processing unit (MPU), or the like. The processor 12 performs control in response to a request when the request is received from the host via the host interface 13. For example, the processor 12 instructs the memory interface 15 to write user data and a parity in the nonvolatile memory 2 in response to a request from the host. The processor 12 instructs the memory interface 15 to read user data and a parity from the nonvolatile memory 2 in response to a request from the host.

The processor 12 determines a region (hereinafter referred to as a memory region) where user data accumulated in the RAM 11 is stored on the nonvolatile memory 2. The user data is stored in the RAM 11 via the internal bus 16. The processor 12 determines a memory region for data in a page unit which is a write unit, that is, page data. In the specification, user data stored in one page of the nonvolatile memory 2 is defined as unit data. For example, a unit data is encoded and stored in the nonvolatile memory 2 as a code word.

It should be noted that encoding is optional. The memory controller 1 may store unit data in the nonvolatile memory 2 without encoding, but is configured to encode unit data as one configuration example in FIG. 1. When the memory controller 1 does not perform encoding, page data matches unit data. One code word may be generated based on one piece of unit data or one code word may be generated based on divided data into which the unit data is divided. One code word may be generated using a plurality of pieces of unit data.

The processor 12 determines a memory region of the nonvolatile memory 2 of a write destination for each unit data. A physical address is allocated to the memory region of the nonvolatile memory 2. The processor 12 manages a memory region of a write destination of the unit data using the physical address. The processor 12 designates the physical address of the determined memory region and instructs the memory interface 15 to write the user data in the nonvolatile memory 2. The processor 12 manages correspondence between a logical address (a logical address managed by the host) and a physical address of the user data. When a read request including the logical address is received from the host, the processor 12 specifies the physical address corresponding to the logical address, designates the physical address, and instructs the memory interface 15 to read the user data.

The ECC circuit 14 encodes user data stored in the RAM 11 to generate a code word. The ECC circuit 14 decodes the code word read from the nonvolatile memory 2. The RAM 11 temporarily stores the user data received from the host until the user data is stored in the nonvolatile memory 2, or temporarily stores data read from the nonvolatile memory 2 until the data is transmitted to the host. The RAM 11 is, for example, a general-purpose memory such as a static random access memory (SRAM) or a dynamic random access memory (DRAM).

FIG. 1 illustrates a configuration example in which the memory controller 1 includes the ECC circuit 14 and the memory interface 15. However, the ECC circuit 14 may be built in the memory interface 15. The ECC circuit 14 may be built in the nonvolatile memory 2.

When a write request is received from the host, the memory controller 1 operates as follows. The processor 12 temporarily stores write data in the RAM 11. The processor 12 reads data stored in the RAM 11 and inputs the data to the ECC circuit 14. The ECC circuit 14 encodes the input data and provides the code word to the memory interface 15. The memory interface 15 writes the input code word in the nonvolatile memory 2.

When a read request is received from the host, the memory controller 1 operates as follows. The memory interface 15 provides the code word read from the nonvolatile memory 2 to the ECC circuit 14. The ECC circuit 14 decodes the input code word and stores the decoded data in the RAM 11. The processor 12 transmits the data stored in the RAM 11 to the host via the host interface 13.

Schematic Configuration of Nonvolatile Memory

Figure 2:
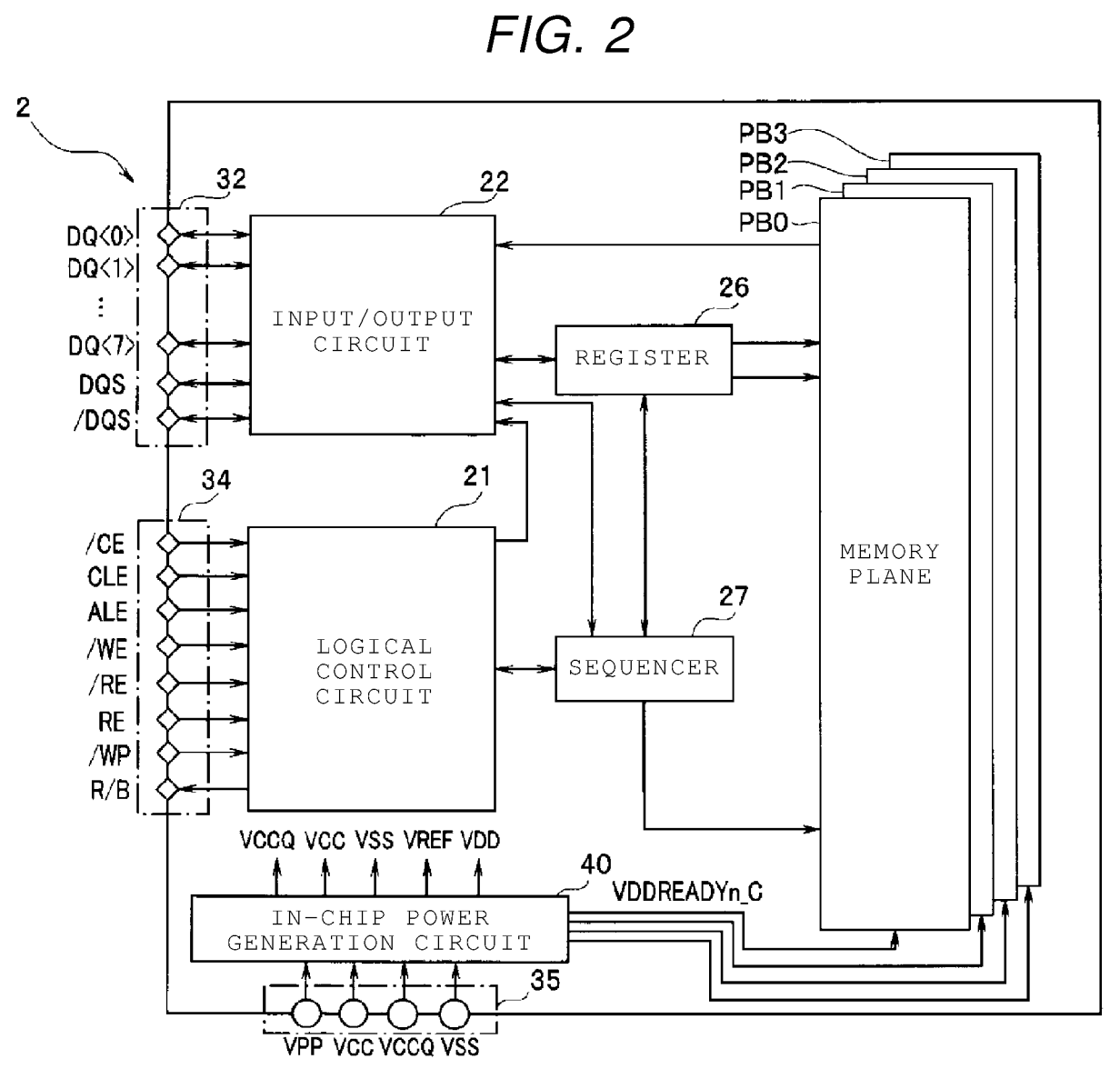
Figure 3:
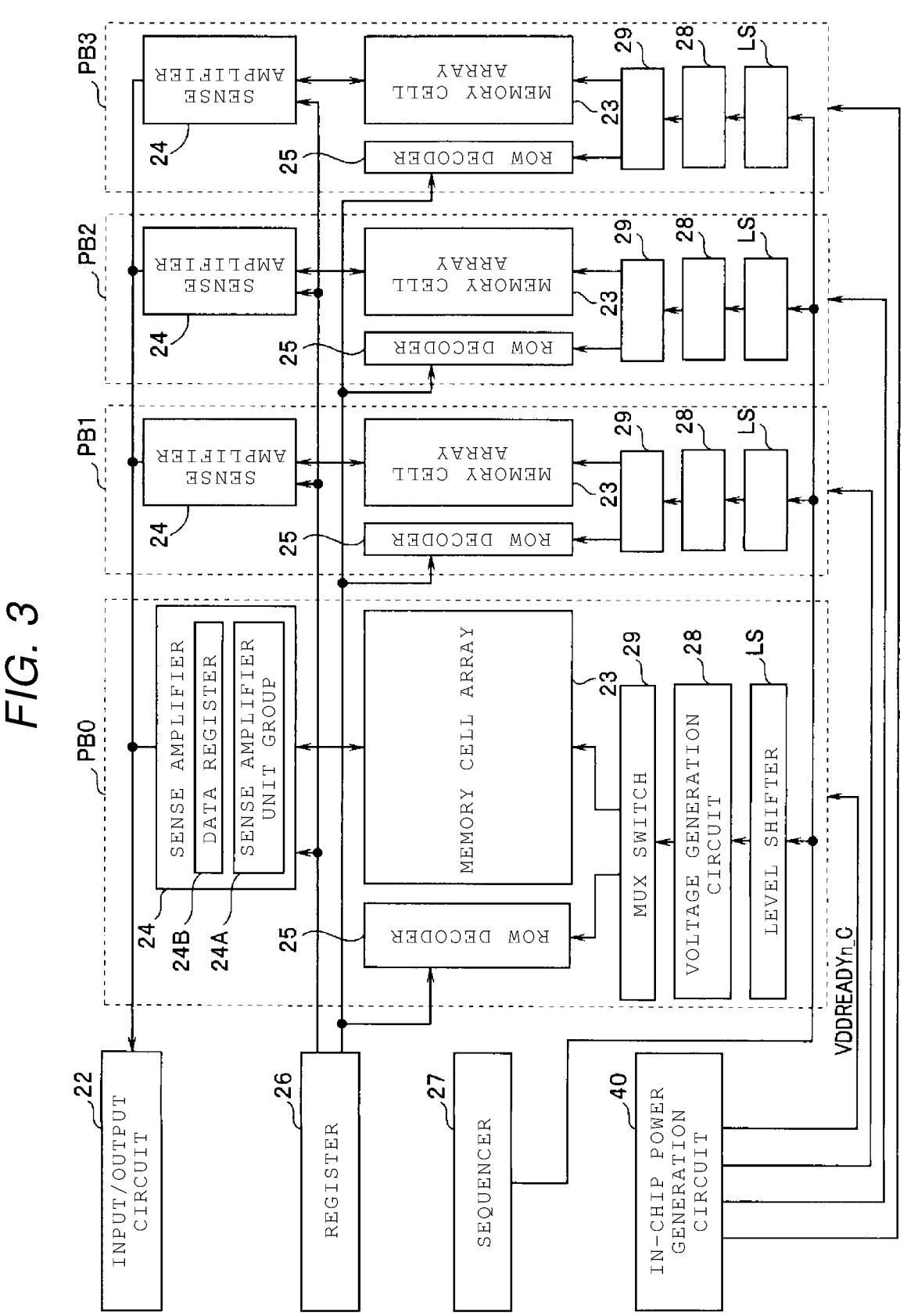
FIG. 3 is a block diagram illustrating an example of a specific configuration of a plurality of planes in FIG. 2.

FIG. 2 is a block diagram illustrating a configuration example of a nonvolatile memory according to the embodiment. FIG. 3 is a block diagram illustrating an example of a specific configuration of a plurality of planes in FIG. 2.

The nonvolatile memory 2 includes a logical control circuit 21, an input/output circuit 22, a register 26, a sequencer 27, an input/output pad group 32, a logical control pad group 34, a power input pad group 35, and a plurality of planes PB0, PB1, . . . (hereinafter referred to planes PB when it is not necessary to distinguish the planes PB0, PB1, . . . ). FIG. 2 illustrates an example in which the number of planes PB is 4, but the number of planes provided in the nonvolatile memory 2 is not limited thereto. For example, the number of planes provided in the nonvolatile memory 2 may be 2, 3, 8, 16, or the like.

Since the input/output pad group 32 transmits and receives each signal including data to and from the memory controller 1, the input/output pad group 32 includes a plurality of terminals (pads) corresponding to a signal DQ<7:0> and data strobe signals DQS and /DQS.

A signal to which a sign "/" is attached to the beginning indicates an active low or negative logical signal. That is, a signal to which the sign "/" is not attached to the beginning becomes active when the signal is in an "H" level, but a signal to which the signal "/" is attached to the beginning becomes active when the signal is in an "L" level.

To transmit and receive each signal to and from the memory controller 1, the logical control pad group 34 includes a plurality of terminals (pads) corresponding to a chip enable signal /CE, a command latch enable signal CLE, an address latch enable signal ALE, a write enable signal /WE, read enable signals RE and /RE, a write protection signal /WP, and a ready/busy signal R/B.

The signal /CE enables the nonvolatile memory 2 to be selected. The signal CLE enables a command transmitted as the signal DQ to be latched in a command register. The signal ALE enables an address transmitted as the signal DQ to be latched in an address register. The signal /WE enables writing. The signals RE and /RE enable reading. The signal /WP prohibits writing and erasing. The signal R/B indicates whether the nonvolatile memory 2 is in a ready state (a state in which a command can be received from the outside) or in a busy state (a state in which a command cannot be received from the outside). The memory controller 1 ascertains a state of the nonvolatile memory 2 by receiving the signal R/B.

To supply various types of operation power from the outside to the nonvolatile memory 2, the power input pad group 35 includes a plurality of power pads inputting power supply voltages VCC, VCCQ, and VPP and a ground voltage VSS. The power supply voltage VCC is a circuit power supply voltage supplied generally as an operation power from the outside and is, for example, a voltage of about 3.3 V. The power supply voltage VCCQ is, for example, a voltage of 1.2 V. The power supply voltage VCCQ is used to transmit and receive a signal between the memory controller 1 and the nonvolatile memory 2. The power supply voltage VPP is a power supply voltage higher than the power supply voltage VCC and is, for example, a voltage of 12 V.

Various voltages from the power input pad group 35 are supplied to an in-chip power generation circuit 40. As will be described below, the in-chip power generation circuit 40 generates various power supply voltages which are used for the nonvolatile memory 2 and supplies the power supply voltages to each unit in the nonvolatile memory 2.

The logical control circuit 21 and the input/output circuit 22 are connected to the memory controller 1 via a NAND bus. The input/output circuit 22 transmits and receives signals DQ (for example, DQ0 to DQ7) to and from the memory controller 1 via the NAND bus.

The logical control circuit 21 receives external control signals (for example, the chip enable signal /CE, the command latch enable signal CLE, the address latch enable signal ALE, the write enable signal AYE, the read enable signal RE and /RE, and the write protection signal /WP) from the memory controller 1 via the NAND bus. The logical control circuit 21 transmits the read/busy signal RB to the memory controller 1 via the NAND bus.

The register 26 includes a command register, an address register, a status register, and the like. The command register temporarily stores a command. The address register temporarily stores an address. The status register temporarily stores data necessary for an operation of the nonvolatile memory 2. The register 26 is configured with, for example, SRAM.

The sequencer 27 is a control circuit that receives a command from the register 26 and controls the nonvolatile memory 2 according to a sequence based on the command.

In each plane PB, a memory cell array 23 is provided. The memory cell array 23 includes a plurality of blocks. Each of the plurality of blocks BLK includes a plurality of memory cell transistors (also referred to herein as "memory cells"). In the memory cell array 23, a plurality of bit lines, a plurality of word lines, a plurality of source lines, and the like control voltages applied to the memory cell transistors.

The planes PB0 to PB3 illustrated in FIG. 3 have the same structure. Each plane PB includes a level shifter LS, a voltage generation circuit 28, an MUX switch 29, a memory cell array 23, a sense amplifier 24, and a row decoder 25.

The level shifter LS converts a level of a signal from the sequencer 27 into a level appropriate for driving each circuit at a rear stage and outputs the converted level of the signal. Actually, in each plane PB, a plurality of level shifters are provided to generate a level appropriate for driving each circuit at a rear stage. However, only one level shifter LS appropriate for driving the voltage generation circuit 28 is illustrated in FIG. 3.

The voltage generation circuit 28 receives a power supply voltage from the outside of the nonvolatile memory 2 and uses the power supply voltage to generate a plurality of voltages necessary for a write operation, a read operation, and an erasing operation. The voltage generation circuit 28 is configured with a charge pump, a regulator, or the like (not illustrated) to generate various voltages and supplies the generated voltages to the memory cell array 23, the sense amplifier 24, and the row decoder 25 in the plane PB via the MUX switch 29.

That is, voltages used for writing and reading by the memory cell array 23, the sense amplifier 24, the row decoder 25 are generated in the voltage generation circuit 28. The voltage generation circuit 28 generates various voltages necessary for writing, various voltage necessary for reading, and various voltage necessary for erasing, and outputs the generated voltages to the MUX switch 29. The MUX switch 29 performs a switch to supply the various voltages generated by the voltage generation circuit 28 to a particular wiring according to a write sequence and a read sequence.

The row decoder 25 receives a row address from the register 26 and decodes the row address. The row decoder 25 performs an operation of selecting a word line based on the decoded row address. Then, the row decoder 25 transmits a plurality of voltages necessary for a write operation, a read operation, and an erasing operation to a selected block.

The sense amplifier 24 receives a column address from the register 26 and decodes the column address. The sense amplifier 24 includes a sense amplifier unit group 24A connected to each bit line. The sense amplifier unit group 24A selects a bit line based on the decoded column address. The sense amplifier unit group 24A detects and amplifies data read from the memory cell transistor to the bit line during reading of the data. The sense amplifier unit group 24A transmits write data to the bit line during writing of the data.

The sense amplifier 24 includes a data register 24B. When reading data, the data register 24B temporarily stores data detected by the sense amplifier unit group 24A and transmits the data to the input/output circuit 22 serially. When writing data, the data register 24B temporarily stores the data transmitted serially from the input/output circuit 22 and outputs the data to the sense amplifier unit group 24A. The data register 24B is configured with SRAM or the like.

Block Configuration of Memory Cell Array

Figure 4:
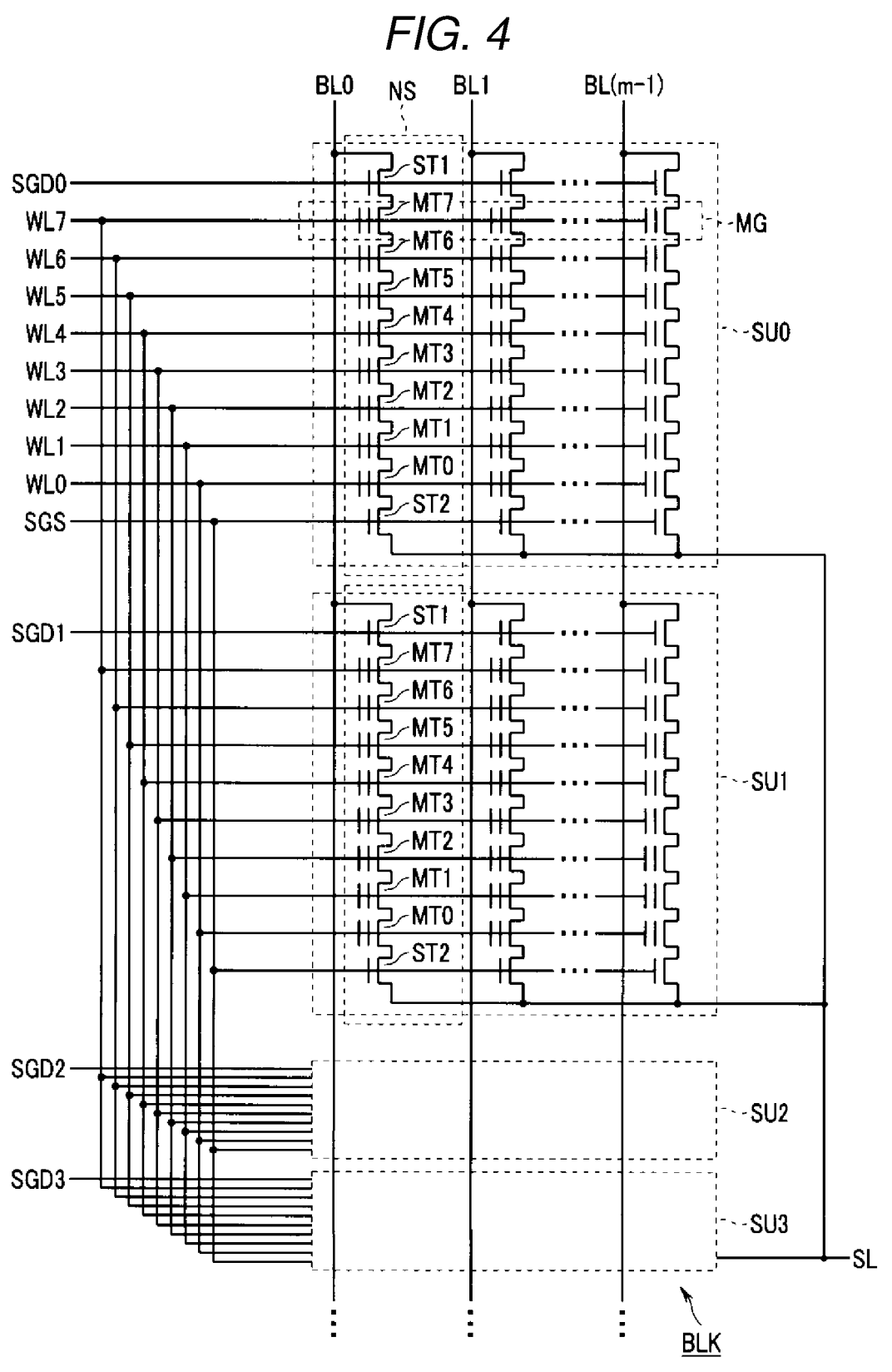

FIG. 4 is a diagram illustrating an equivalent circuit of a block BLK of the NAND memory cell array 23 with a 3-dimensional structure in the nonvolatile memory 2 according to the embodiment. FIG. 4 illustrates one block BLK among a plurality of blocks provided in the memory cell array 23. The other blocks of the memory cell array have similar structures as the structure of FIG. 4. The embodiment is also applicable to a memory cell array with a 2-dimensional structure.

As illustrated, the block BLK includes, for example, four string units SU0 to SU3 (hereinafter referred to as string units SU representing the string units). Each string unit SU includes a NAND string NS that includes a plurality of memory cell transistors MT (MT0 to MT7) and select gate transistors ST1 and ST2. The number of memory cell transistors MT provided in the NAND string NS are eight in FIG. 4, but more may be used. The select gate transistors ST1 and ST2 are illustrated as a one-gate transistor on an electrical circuit, but may be the same as the memory cell transistors in structure. A plurality of select gate transistors may be used as the select gate transistors ST1 and ST2. Dummy cell transistors may be provided between the memory cell transistors MT and the select gate transistors ST1 and ST2.

The memory cell transistors MT are connected in series between the select gate transistors ST1 and ST2. The memory cell transistor MT7 on one end side (a bit line side)

is connected to the select gate transistor ST1 and the memory cell transistor MT0 on the other end side (a source line side) is connected to the select gate transistor ST2.

Gates of the select gate transistors ST1 of the string units SU0 to SU3 are respectively connected to select gate lines SGD0 to SGD3 (hereinafter referred to as select gate lines SGD representing the select gate lines). Gates of the select gate transistors ST2 of the string units SU0 to SU3 are commonly connected to a select gate line SGS.

The gates of the memory cell transistors MT0 to MT7 in the same block BLK are commonly connected to the word lines WL0 to WL7, respectively. That is, while the word lines WL0 to WL7 are commonly connected between the plurality of string units SU0 to SU3 in the same block BLK, the select gate lines SGD are independent for each of the string units SU0 to SU3 even in the same block BLK. A gate of a memory cell transistor MTi in the same row in the block BLK is connected to the same word line WLi.

Each NAND string NS is connected to a corresponding bit line. Accordingly, each memory cell transistor MT is connected to a bit line via the select gate transistors ST1 and ST2 or another memory cell transistor MT provided in the NAND string NS. In general, data of the memory cell transistors MT in the same block BLK are collectively erased. On the other hand, in general, data is collectively read from and written in the plurality of memory cell transistors MT commonly connected to one word line WL wired in one string unit SU. A set of the memory cell transistors MT sharing the word line WL in one string unit SU is referred to as a memory cell group MG.

A write operation and a read operation on the memory cell group MG is performed in a page unit. For example, when each cell is the TLC (Triple Level Cell) capable of storing 3-bit (eight values) data, one memory cell group MG can store data corresponding to three pages. Three bits which can be stored by each memory cell transistor MT respectively correspond to the three pages.

Figure 5:
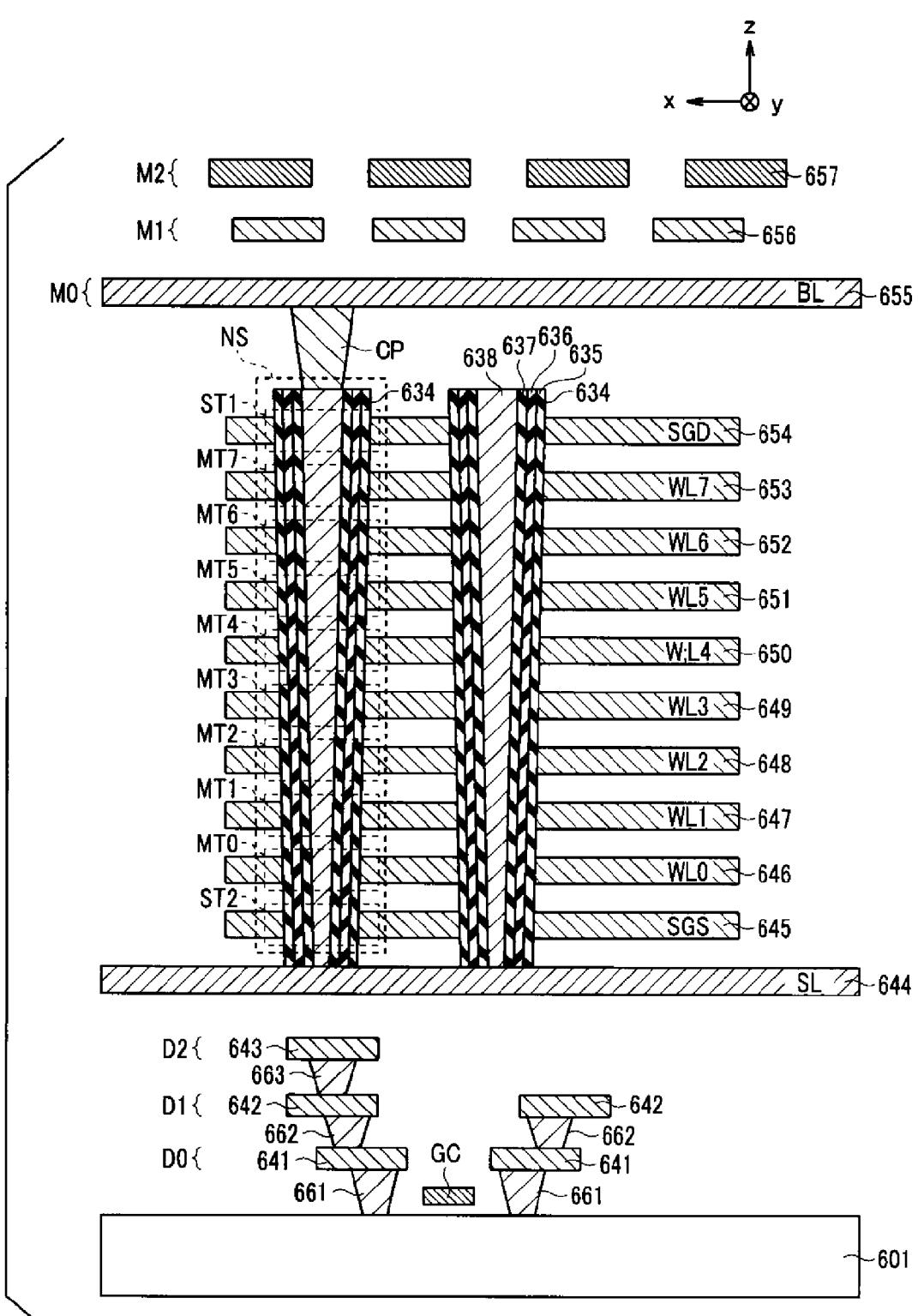
FIG. 5 is a diagram illustrating a configuration example of the block of the NAND memory cell array with a 3-dimensional structure in the nonvolatile memory according to the embodiment.

FIG. 5 is a diagram illustrating a configuration example of a block BLK of the NAND memory cell array 23 with a 3-dimensional structure in the nonvolatile memory 2 according to the embodiment. FIG. 5 illustrates one block BLK among the plurality of blocks provided in the memory cell array 23. The other blocks of the memory cell array 23 have configurations similar to the configuration of FIG. 5.

More specifically, FIG. 5 is a partial cross-sectional view illustrating the block BLK of the NAND memory cell array 23 in the nonvolatile memory 2 according to the embodiment. As illustrated in FIG. 5, transistors provided in peripheral circuits such as the sense amplifier 24 and the row decoder 25 are formed on a semiconductor substrate 601, and the memory cell transistors provided in the memory cell array 23 are formed above. In the following description, two orthogonal directions parallel to the surface of the semiconductor substrate 601 are assumed to be x and y directions and a direction perpendicular to the surface of the semiconductor substrate 601 is assumed to be a z direction.

In FIG. 5, a p-type or n-type well region formed on the upper portion of the semiconductor substrate 601, an impurity diffusion region formed in each well region, and an element isolation region insulating between the well regions are not illustrated. A conductor GC is provided above the semiconductor substrate 601 with a gate insulating film (not illustrated) interposed therebetween. A plurality of contacts 661 are provided in the plurality of impurity diffusion regions (not illustrated) provided on the semiconductor substrate 601 with the conductor GC interposed therebetween. A plurality of conductors 641 serving as wiring patterns are respectively connected to the plurality of contacts 661. For example, the conductor GC functions as a gate electrode of the transistor and the conductor 641 functions as a source electrode or a drain electrode of the transistor.

For example, a contact 662 is provided on the conductor 641, the conductor 642 serving as a wiring pattern is connected to the contact 662, a contact 663 is provided on the conductor 642, and a conductor 643 serving as a wiring pattern is connected to the contact 663. Wiring layers provided with the conductors 641, 642, and 643 are respectively referred to as wiring layers D0, D1, and D2. The wiring layers D0, D1, and D2 are provided in a lower layer portion of the nonvolatile memory 2. The wiring layers provided in the lower layer portion of the nonvolatile memory 2 are not limited to three layers. The wiring layers may be configured as two or less layers or four or more wiring layers may be provided.

For example, a conductor 644 is provided above the conductor 643 with an inter-layer insulating film (not illustrated) interposed therebetween. The conductor 644 is formed in a plate shape parallel to an xy plane and functions as, for example, a source line SL. For example, conductors 645 to 654 are stacked in order in the z direction above the conductor 644 with inter-layer insulating films (not illustrated) interposed therebetween.

Each of the conductors 645 to 654 is formed in a plate shape parallel to, for example, the xy plane. For example, the conductor 645 functions as the select gate line SGS, the conductors 646 to 653 respectively function as the word lines WL0 to WL7, and the conductor 654 functions as the select gate line SGD.

A memory pillar 634 with a columnar shape penetrates through each of the conductors 645 to 654 and come into contact with the conductor 644. The memory pillar 634 includes, for example, a semiconductor layer 638 on a central side, a tunnel insulating film 637 formed on the outer side of the semiconductor layer 638, a charge storage film 636 on the outer side of the tunnel insulating film 637, and a block insulating film 635 formed on the outer side of the charge storage film 636. An intersection between the memory pillar 634 and each of the conductors 646 to 654 functions as a memory cell transistor (memory cell) MT. An intersection between the memory pillar 634 and each of the conductors 645 and 654 functions as a select transistor ST.

A conductor 655 is provided in a layer above the upper surface of the memory pillar 634 with an inter-layer insulating film (not illustrated) interposed therebetween. The conductor 655 is formed in a line shape in the x direction to function as a bit line BL. A plurality of conductors 655 are located in the y direction at intervals. The conductor 655 is electrically connected to the semiconductor layer 638 inside one memory pillar 634 corresponding to each string unit SU with a contact plug CP interposed therebetween.

Specifically, in each string unit SU, for example, the contact plug CP is provided on the semiconductor layer 638 in each memory pillar 634 and one conductor 655 is provided on the contact plug CP. The configuration of the embodiment is not limited thereto. For example, the semiconductor layer 638 and the conductor 655 may be further connected with a plurality of contacts, wirings, or the like interposed therebetween.

A conductor 656 is provided above a layer in which the conductor 655 is provided, with an inter-layer insulating film (not illustrated) interposed therebetween. A conductor 657 is provided above a layer in which the conductor 656 is provided, with an inter-layer insulating film (not illustrated) interposed therebetween.

The conductors 656 and 657 function as, for example, wirings that connects wirings provided in the memory cell array 23 and peripheral circuits provided in a lower layer of the memory cell array 23. The layers provided with the conductors 655, 656, and 657 are referred to as wiring layers M0, M1, and M2, respectively.

Row Decoder

Figure 6:
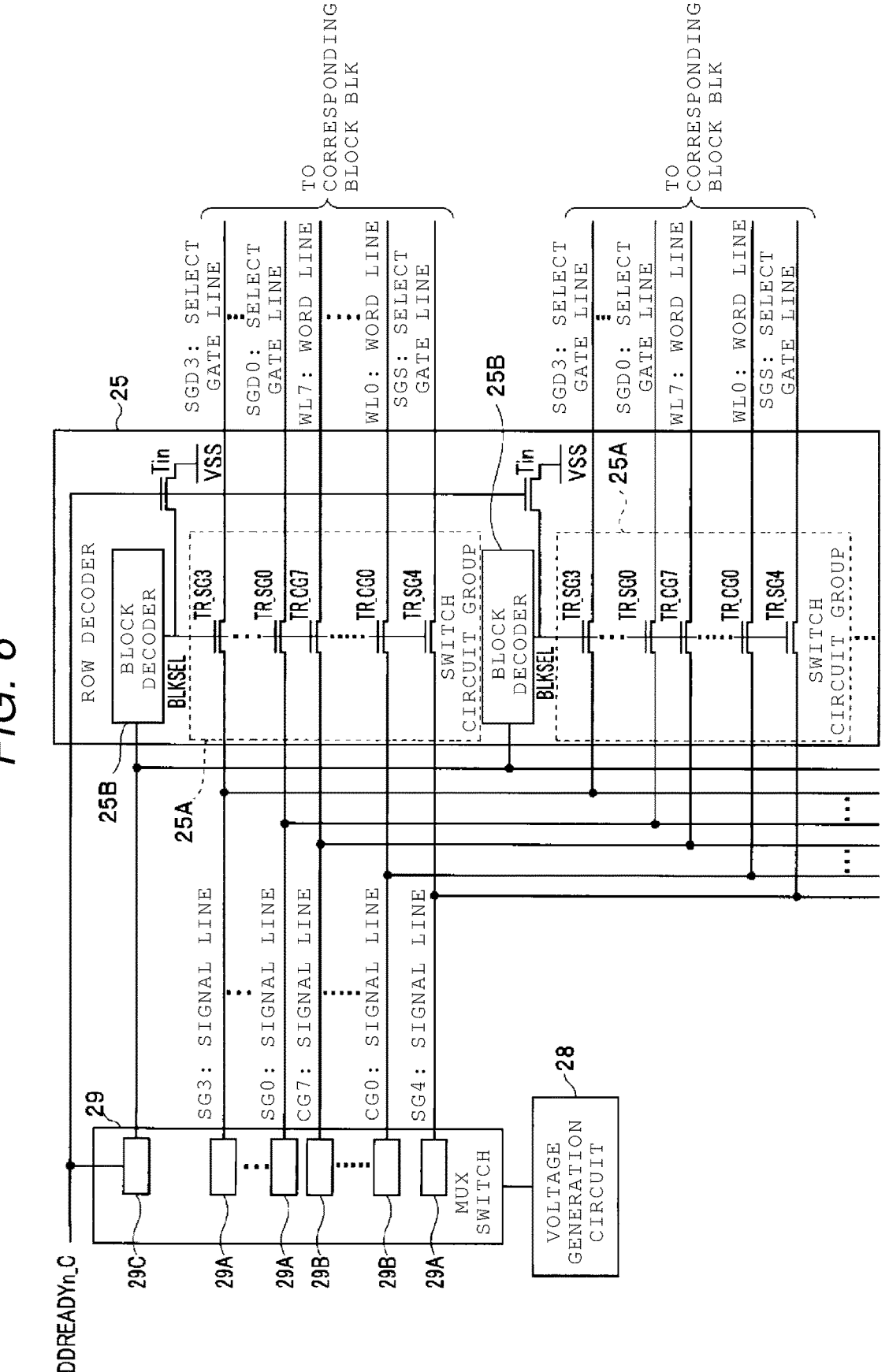
FIG. 6 is a block diagram illustrating an example of a configuration of a MUX switch and a row decoder.

FIG. 6 is a block diagram illustrating an example of a configuration of the MUX switch 29 and the row decoder 25. Only a configuration of a part of the MUX switch 29 is illustrated in FIG. 6.

In FIG. 6, the MUX switch 29 includes changeover switches 29A, 29B, and 29C. The changeover switch 29A supplies voltages from the voltage generation circuit 28 to the signal lines SG0 to SG4, respectively. A plurality of changeover switches 29B supply voltages from the voltage generation circuit 28 to the signal lines CG0 to CG7, respectively. An operation permission signal VDDREADYn_c controlling a reset state is supplied to the changeover switch 29C and a gate of a transistor Tin. As will be described below, the operation permission signal VDDREADYn_c is in a high level (H level) at the time of initialization and enters a low level (L level) when the initialization ends and a reset release timing is reached. When the operation permission signal VDDREADYn_c decreases, the changeover switch 29C supplies a block decoder 25B with a voltage VGBST from the voltage generation circuit 28.

The signal lines SG0 to SG4 and CG0 to CG7 are branched by the row decoder 25 and connected to wirings of each block BLK. That is, the signal lines SG0 to SG3 function as global drain-side select gate lines and are connected to select gate lines SGD0 to SGD3 serving as local select gate lines in each block BLK via the row decoder 25. The signal lines CG0 to CG7 function as global word lines and are connected to the word lines WL0 to WL7 serving as local word lines in each block BLK via the row decoder 25. The signal line SG4 functions as a global source-side select gate line and is connected to the select gate line SGS serving as a local select gate line in each block BLK via the row decoder 25.

The voltage generation circuit 28 is controlled by the sequencer 27 to generate various voltages. The changeover switches 29A and 29B supply various voltages generated by the voltage generation circuit 28 to the corresponding signal lines SG0 to SG4 and signal lines CG0 to CG7, respectively. For example, each changeover switch 29B selects and supplies a voltage such as a voltage VCGRV, a voltage VREAD, or a voltage VCG_ER to the corresponding word line WL according to an operation target (a row address) in a read operation.

The row decoder 25 includes a plurality of switch circuit groups 25A corresponding to each block and a plurality of block decoders 25B respectively provided for the plurality of switch circuit groups 25A. Each switch circuit group 25A includes a plurality of transistors TR_SG0 to TR_SG3 respectively connecting the signal lines SG0 to SG3 to the select gate lines SGD0 to SGD3, a plurality of transistors TR_CG0 to TR_CG7 respectively connecting the signal lines CG0 to CG7 to the word lines WL0 to WL7, and a transistor TR_SG4 connecting the signal line SG4 to the select gate line SGS. Each of the transistors TR_SG0 to TR_SG4 and the transistors TR_CG0 to TR_CG7 is a high breakdown voltage transistor.

Each block decoder 25B supplies a block select signal BLKSEL to gates of the transistors TR_SG0 to TR_SG4 and the transistors TR_CG0 to TR_CG7 when the block decoder

25B is designated with a row address. Accordingly, in the switch circuit group 25A supplied with the block select signal BLKSEL from the block decoder 25B designated with the row address, the transistors TR_SG0 to TR_SG4 and the transistors TR_CG0 to TR_CG7 enter an ON state and are electrically connected. Therefore, voltages supplied from the voltage generation circuit 28 to the signal lines SG0 to SG4 and the signal lines CG0 to CG7 are supplied to the select gate lines SGD0 to SGD3 and SGS and the word lines WL0 to WL7 provided in the operation target block BLK.

That is, the voltage generation circuit 28, the MUX switch 29, and the row decoder 25 supply various voltages necessary for operation to each word line WL. For example, a voltage VSGD is supplied to the select gate line SGD (SGDsel) connected to the select gate transistor ST1 which belongs to the operation target string unit SU, the voltage VSS is supplied to the select gate line SGD (SGDusel) connected to the select gate transistor ST1 which does not belong to the operation target string unit SU, and a voltage VSGS is supplied to the select gate select gate line SGS collectively connected to the select gate transistor ST2 in each block BLK.

It is necessary for the block decoder 25B to generate the block select signal BLKSEL with a voltage higher than a voltage VPGM to electrically connect each transistor of the switch circuit group 25A. The block decoder 25B generates the block select signal BLKSEL with a high voltage using the voltage VGBST supplied from the changeover switch 29C of the MUX switch 29.

An output terminal of each block decoder 25B is connected to a reference voltage point (VSS) along a current route of the transistor Tin. When the operation permission signal VDDREADYn_C rises immediately after power supply, the transistor Tin is turned on to initialize a voltage of the output terminal of the block decoder 25B to VSS.

Figure 7:
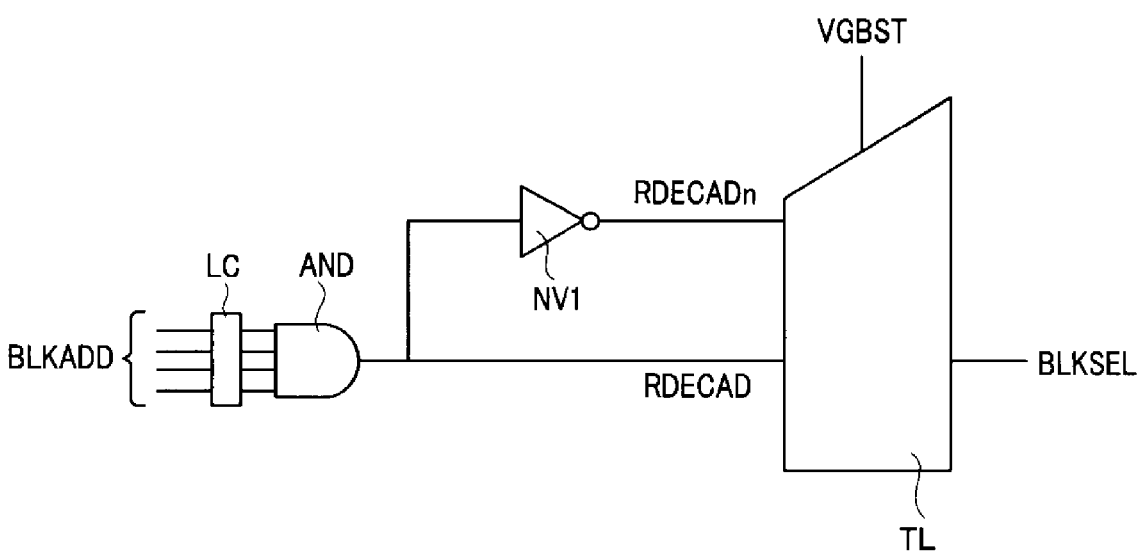
FIG. 7 is a block diagram illustrating an example of a configuration of a block decoder.

FIG. 7 is a block diagram illustrating an example of a configuration of a block decoder. The block decoder 25B includes, for example, a logical circuit LC, a logical AND circuit AND, an inverter NV1, and a level conversion circuit TL.

The logical circuit LC outputs an output signal based on a block address signal BLKADD input from the register 26. In the logical circuit LC, all the output signals enter "H" level in the block decoder 25B in which the block address signal BLKADD is hit and one output signal enters "L" level in the block decoder 25B in which the block address signal BLKADD is not hit. The logical AND circuit AND outputs a logical AND result of an output signal of the logical circuit LC as a signal RDECAD to the inverter NV and the level conversion circuit TL. That is, in the block decoder 25B in which the block address signal BLKADD is hit and the corresponding block BLK is determined to be normal, the signal RDECAD with the "H" level is output. In the block decoder 25B in which the block address signal BLKADD is not hit or the corresponding block BLK is determined to be abnormal, the signal RDECAD with the "L" level is output. In the signal RDECAD, a voltage of the "H" level is a voltage VRD, and a voltage of the "L" level is a ground voltage VSS (0 V). For example, a voltage VRD is 2.5 V. The inverter NV1 inverts the signal RDECAD output from the logical AND circuit AND. The inverter NV1 outputs a signal RDECADn as an inversion result.

The level conversion circuit TL converts the signal RDECAD according to the voltage VRD into the signal BLKSEL according to the high power supply voltage (VGBST). Specifically, when the signal RDECAD with the "H" level according to the power supply voltage VRD and the signal RDECADn with the "L" level are input, the level conversion circuit TL converts the signals into the signal BLKSEL with the "H" level according to the power supply voltage VGBST and outputs the signal BLKSEL. When the signal RDECAD with the "L" level and the signal RDEC-ADn with the "H" level are input, the level conversion circuit TL outputs the signal RDECAD with the "L" level as the signal BLKSEL with the "L" level. As the power supply voltage VGBT, a voltage is set for turning on all of the transistors TR_SG0 to TR_SG4 and the transistors TR_CG0 to TR_CG7 of the switch circuit group 25A corresponding to a selected block. In a read operation, the power supply voltage VGBT is set to a voltage (for example, 15 V) higher than the voltage VREAD.

Figure 8:
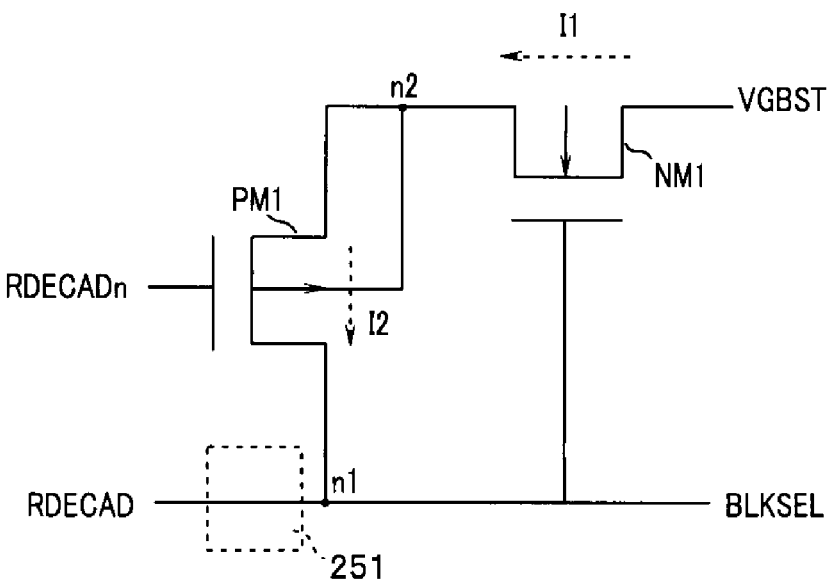
FIG. 8 is a block diagram illustrating an example of a configuration of a level conversion circuit.

FIG. 8 is a block diagram illustrating an example of a configuration of a level conversion circuit. The level conversion circuit TL includes a depression type NMOS transistor NM1 and PMOS transistor PM1 with a high breakdown voltage. The power supply voltage VGBST is input to one end of the NMOS transistor NM1. The other end of the NMOS transistor NM1 is connected to one end of the PMOS transistor PM1. The signal RDECAD is input to the other end of the PMOS transistor PM1. The signal RDECAD is also input to a gate of the NMOS transistor NM1. The signal RDECADn is input to a gate of the PMOS transistor PM1. The signal BLKSEL is output from the other end of the PMOS transistor PM1. A backflow prevention circuit 251 is provided between an input terminal of the signal RDECAD and a connection point n1 of the other end of the PMOS transistor PM1, an input terminal of the signal RDECAD, and the output terminal of the signal BLKSEL.

When the signal RDECAD is at the "H" level, that is, the voltage VRD, and the signal RDECADn is at the "L" level, that is, the voltage VSS, the NMOS transistor NM1 and the PMOS transistor PM1 are turned on. Accordingly, the power supply voltage VGBST input to one end of the NMOS transistor NM1 is output as the signal BLKSEL. The power supply voltage VGBST is higher than the voltage VSS, but the backflow prevention circuit 251 is provided. Therefore, outflow of the signal RDECAD to the input terminal side is prevented. Thus, the output level of the signal BLKSEL is maintained at the power supply voltage VGBST.

When the signal RDECAD is at the "L" level, that is, the voltage VSS, and the signal RDECADn is at the "H" level, that is, the voltage VRD, the NMOS transistor NM1 is a depression type transistor and thus does not completely enter an OFF state. Therefore, since a current I1 flows in the NMOS transistor NM1, a voltage of a connection point n2 of the NMOS transistor NM1 and the PMOS transistor PM1 is boosted, for example, about 2.0 V. Meanwhile, the voltage VRD is applied to the gate of the PMOS transistor PM1. Since the voltage VRD is, for example, 2.5 V, a voltage applied to the gate is higher than the voltage of the connection point n2. Thus, the PMOS transistor PM1 is turned off. Accordingly, the voltage VSS is output as the signal BLKSEL.

Peak Current

The above-described various power supply voltages are supplied from an external power circuit to each of the power pads of the power input pad group 35 directly or via the memory controller 1. The in-chip power generation circuit 40 generates an internal power supply voltage for operating each unit of the nonvolatile memory 2 using the power supply voltage supplied via the power input pad group 35. That is, the in-chip power generation circuit 40 is provided with the voltages VPP, VCC, VCCQ, and VSS via the power pads of the power input pad group 35, supplies the voltages VPP, VCC, VCCQ, and VSS to each unit of the nonvolatile memory 2 as they are, and generates the reference voltage VREF and the operation voltage VDD to supply the reference voltage VREF and the operation voltage VDD to each unit of the nonvolatile memory 2.

The in-chip power generation circuit 40 generates the operation voltage VDD using the voltage VCC input via the power pad VCC and supplies the generated operation voltage VDD to each unit of the nonvolatile memory 2 via a VDD supply wiring. The ICC current flowing in the power pad VCC mostly corresponds to a current flowing in the entire nonvolatile memory 2.

Each unit connected to the VDD supply wiring in the nonvolatile memory 2 is a circuit load when the operation voltage VDD is supplied from the in-chip power generation circuit 40. For example, a capacitance of the transistor connected to the VDD supply wiring, a stabilization capacitance connected to the VDD supply wiring, a capacitance of the VDD supply wiring itself, and the like are provided in the circuit load. Immediately after power is supplied, it is necessary to supply the operation voltage VDD from the in-chip power generation circuit 40 to each unit of the nonvolatile memory 2. That is, immediately after power is supplied, it is necessary for the in-chip power generation circuit 40 to supply the operation voltage VDD to a large circuit load. Accordingly, immediately after power is supplied, a peak of the ICC current occurs when each unit of the nonvolatile memory 2 connected to the VDD supply wiring is charged.

Many level shifters that have configurations similar to the level conversion circuit TL illustrated in FIG. 8 are provided not only in the block decoder 25B but also in each unit in the nonvolatile memory 2. Accordingly, after power is supplied, a peak of the ICC current also occurs when all the level shifters in the nonvolatile memory 2 perform the same operation.

For example, immediately after power is supplied, the level shifters or the like are reset to prevent an erroneous operation of a logical circuit or a level shifter (hereinafter referred to as level shifters or the like). For example, in the block decoder 25B of FIG. 6, the transistor Tin is turned on and a voltage of the output terminal of the block decoder 25B is initialized to VSS. When the VDD supply wiring is charged and the operation voltage VDD reaches a specified value, the reset state is released. At a timing of releasing the reset state, outputs of the reset level shifters or the like are changed (in FIG. 6, a voltage of the output terminal of the block decoder 25B is changed) and a peak of the ICC current occurs. In particular, in the nonvolatile memory 2 that has a multi-plane configuration including a plurality of the planes PB, it is easy for a current peak of the ICC current to exceed an assumed current immediately after power is supplied.

According to the first embodiment, occurrence of a peak current is distributed and a peak current is reduced by adjusting a reset release timing for each plane PB and distributing operation periods after releasing the reset state of the plane PB.

In-Chip Power Generation Circuit

Figure 9:
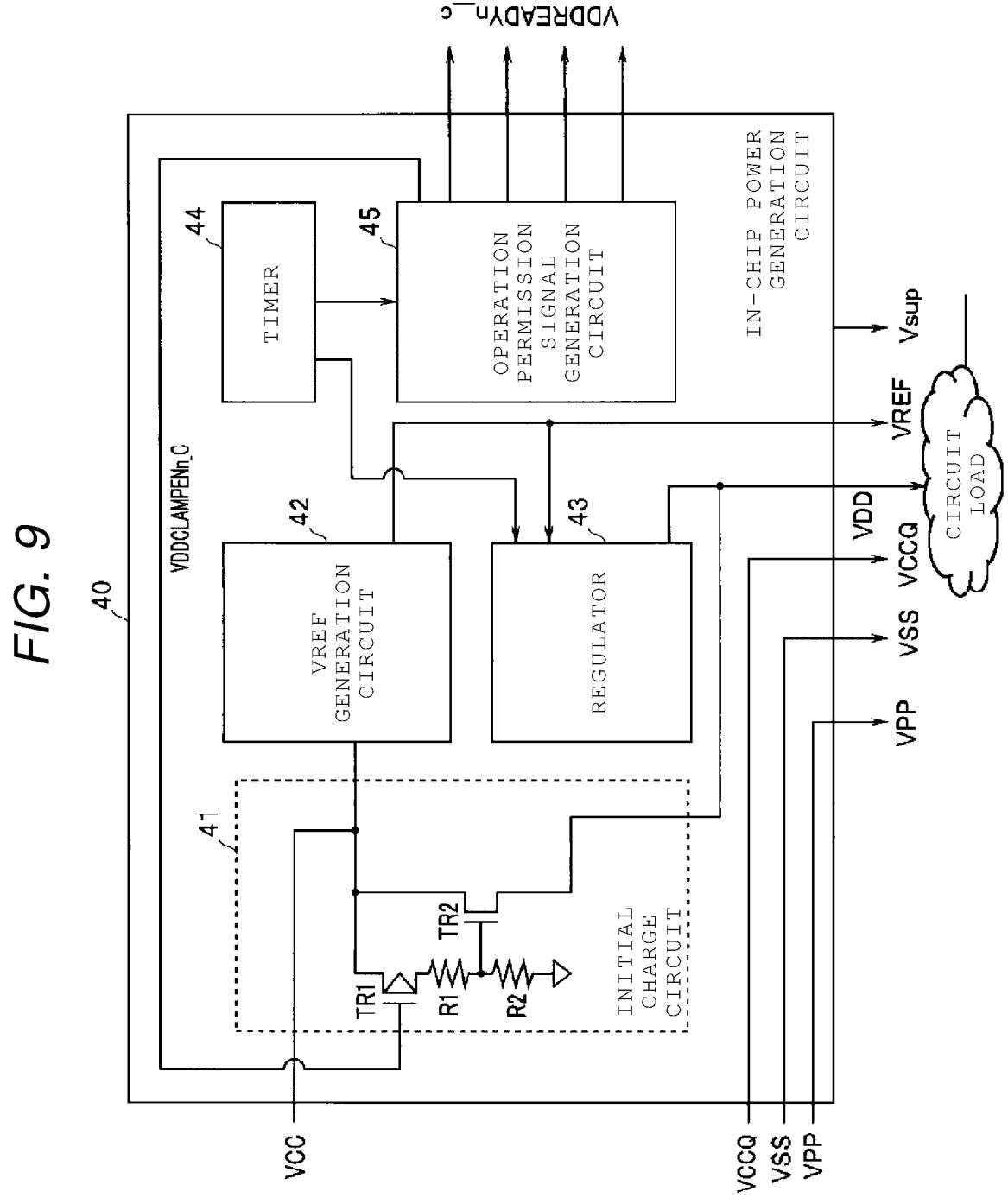
FIG. 9 is a block diagram illustrating an example of a specific configuration of an in-chip power generation circuit.

FIG. 9 is a block diagram illustrating an example of a specific configuration of the in-chip power generation circuit 40.

The in-chip power generation circuit 40 includes an initial charge circuit 41, a VREF generation circuit 42, a regulator 43, a timer 44, and an operation permission signal generation circuit 45. The power supply voltages VCC (for example, 2.5 V), VCCQ (for example 1.2 V), VSS (for example, 0 V) and VPP are supplied to the in-chip power generation circuit 40 from each power pad of the power input pad group 35. The in-chip power generation circuit 40 supplies the power supply voltages VCC, VCCQ, VSS, and VPP to each unit of the nonvolatile memory 2.

Immediately after power is supplied, the operation voltage VDD supplied from the in-chip power generation circuit 40 in the nonvolatile memory 2 is not raised. Therefore, when the logical circuit in the nonvolatile memory 2 is started immediately after power is supplied, an output logic of the logical circuit becomes uncertain and there is a possibility that erroneous operation occurs. The level shifter operates generally at a relatively high voltage. Thus, when the logic becomes uncertain, there is a possibility that a relatively large through-current flows. Accordingly, immediately after power is supplied, the logical circuit or the level shifters or the like in the nonvolatile memory 2 enter a reset state by the operation permission signal VDDREADYn_c generated in the operation permission signal generation circuit 45 to be described below. The initial charge circuit 41 supplies an initial operation voltage VDDint (an initial voltage level) capable of stabilizing an operation of the logical circuit or the like to the circuit load connected to the VDD supply wiring. The regulator 43 raises a charge level of the circuit load connected to the VDD supply wiring from the initial operation voltage VDDint to the operation voltage VDD (a normal voltage level), then releases the reset state, and causes the level shifters or the like to operate.

To manage such operation immediately after power is supplied, the timer 44 is employed. The timer 44 measures a time from the supply of the power and outputs time information. The time information of the timer 44 is supplied to the regulator 43 and the operation permission signal generation circuit 45.

The power supply voltage VCC is supplied to the initial charge circuit 41 from the power pad VCC of the power input pad group 35. In the initial charge circuit 41, the drain of the transistor TR1 is connected to a power line supplied with the power supply voltage VCC and the source of the transistor TR1 is connected to the reference voltage point via resistors R1 and R2. A charge permission signal VDD-CLAMPENn_C with an L level is supplied from the operation permission signal generation circuit 45 to the gate of the transistor TR1.

The power line (the power supply voltage VCC) is connected to the drain of the transistor TR2, and the source of the transistor TR2 is connected to an output end of the initial charge circuit 41. A voltage of a connection point of the resistors R1 and R2 is applied to the gate of the transistor TR2. During an initial charge period, the power supply voltage VCC supplied from the outside is supplied to the circuit load connected to the VDD supply wiring via transistor TR2. According to resistance values of the resistors R1 and R2, it is possible to adjust a level of the initial operation voltage VDDint supplied to the circuit load connected to the VDD supply wiring during the initial charge period. Immediately after power is supplied, the initial charge circuit 41 supplies the initial operation voltage VDDint (the initial voltage level) of about 1.3 V to the circuit load connected to the VDD supply wiring, for example.

The power supply voltage VCC is supplied to the VREF generation circuit 42. The VREF generation circuit 42 may be configured with a known bandgap reference (BGR) circuit and generates a predetermined reference voltage VREF. The VREF generation circuit 42 supplies the generated reference voltage VREF to each unit of the nonvolatile memory 2 and the regulator 43.

After the supply of the power starts, the timer 44 outputs a signal to the regulator 43 and the operation permission signal generation circuit 45 when it is detected that a time required to charge the circuit load connected to the VDD supply wiring with the initial charge voltage VDDint has elapsed and/or a time required for the reference voltage VREF to reach a specified voltage and be stabilized has elapsed. When the signal output from the timer 44 is received, the regulator 43 starts operating. The regulator 43 generates an operation voltage VDD (for example, 2.0 V) using the reference voltage VREF. The regulator 43 supplies the generated operation voltage VDD to each unit of the nonvolatile memory 2 via the VDD supply wiring. When a signal output from the timer 44 is received, the operation permission signal generation circuit 45 changes the charge permission signal VDDCLAMPENn_C from the L level to the H level. Accordingly, the transistor TR1 in the initial charge circuit 41 is turned off and the transistor TR2 is also turned off in association. Accordingly, the VDD supply wiring are cut off from the power supply voltage VCC.

As such, the in-chip power generation circuit 40 supplies the initial operation voltage VDDint to the VDD supply wiring by the initial charge circuit 41 during the initial charge period, and raises the voltage supplied to the VDD supply wiring from the initial operation voltage VDDint to the operation voltage VDD by the regulator 43 during a VDD charge period continuing from the initial charge period. That is, the in-chip power generation circuit 40 charges the circuit load connected to the VDD supply wiring by two stages after the supply of the power supply voltage VCC, and thus an increase in a current peak can be prevented compared to a case in which the power supply voltage VDD is charged by one stage.

The regulator 43 of the in-chip power generation circuit 40 in FIG. 9 generates the operation voltage VDD and the reference voltage VREF as described above. However, in the in-chip power generation circuit 40, various in-chip voltages Vsup supplied to each unit of the nonvolatile memory 2 can be generated. For example, the in-chip power generation circuit 40 includes a charge pump circuit, a linear regulator, or the like (not illustrated) and supplies the power supply voltage VCC supplied from the outside to such circuits, so that the in-chip power supply voltage Vsup can be generated and output.

As described above, various circuits such as the level shifters enter a reset state immediately after power is supplied. The operation permission signal generation circuit 45 generates the operation permission signal VDDREADYn_C for permitting an operation by releasing the reset state of the various circuits such as the level shifters. The operation permission signal generation circuit 45 determines a timing at which the operation permission signal VDDREADYn_C is generated according to the output of the timer 44. In the embodiment, the operation permission signal generation circuit 45 can generate a separate operation permission signal VDDREADYn_C for each plane PB and generate the operation permission signal VDDREADYn_C for instructing a reset release at a different timing for each plane PB.

The operation permission signal VDDREADYn_C from the in-chip power generation circuit 40 is supplied not only to each plane PB but also to the level shifters or the like inside the nonvolatile memory 2 performing the reset release.

Specific Example of Level Shifter

Figure 10:
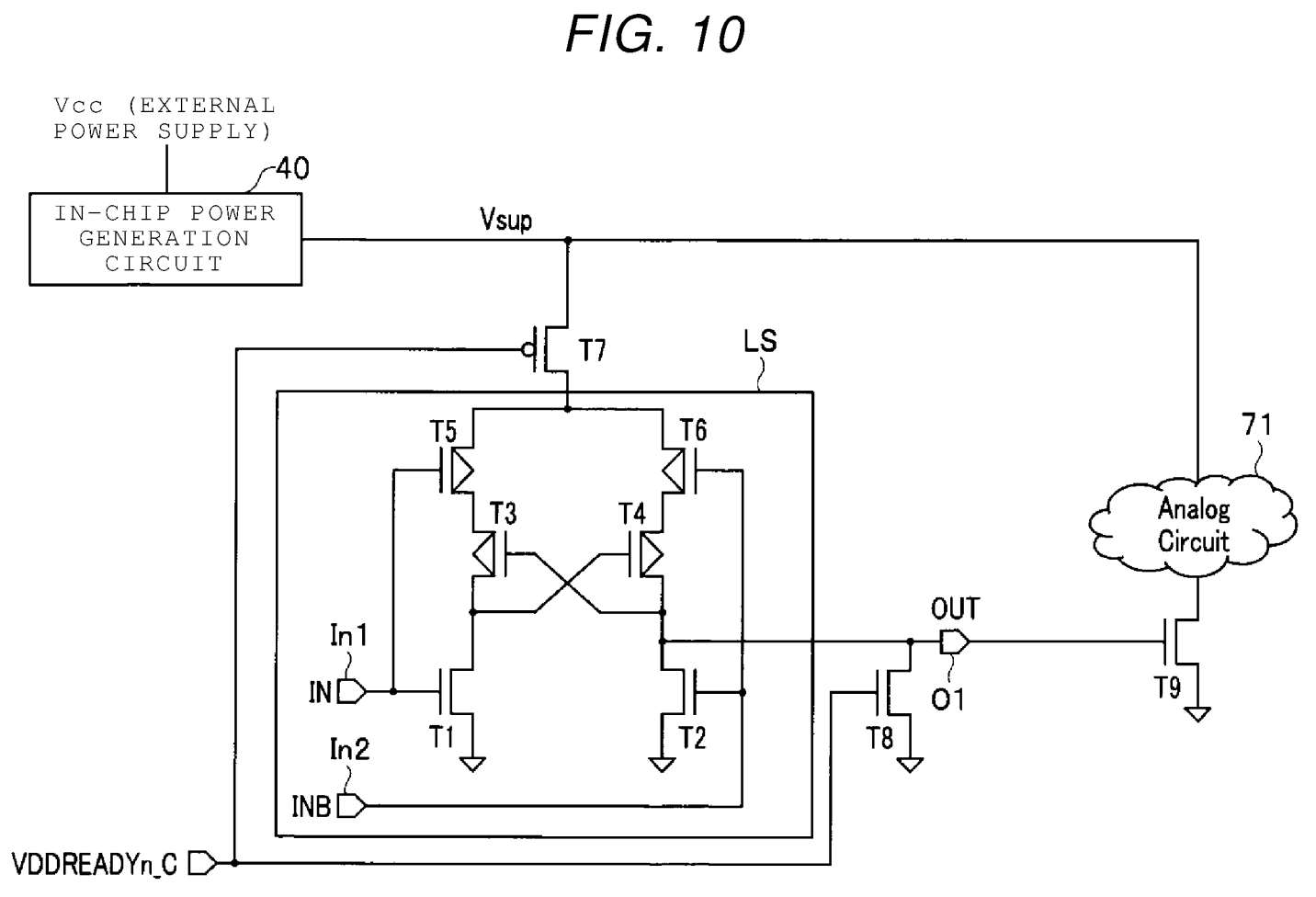
Figure 11:
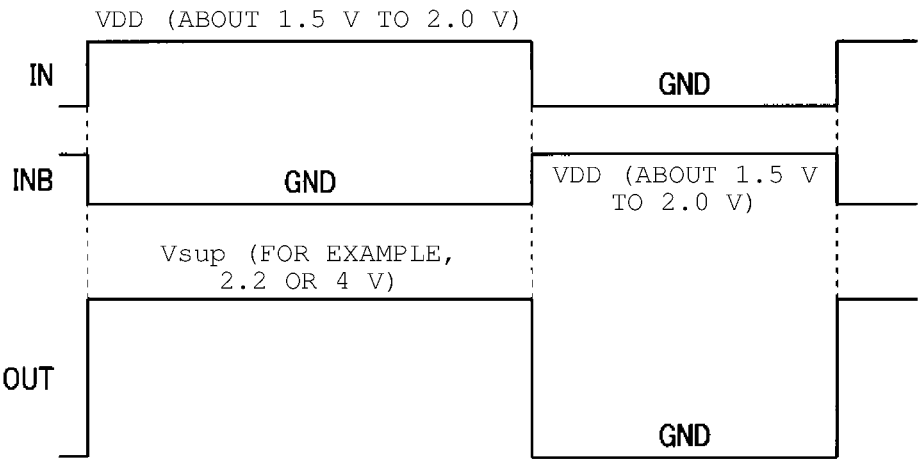
FIG. 11 is a waveform diagram illustrating an operation of the level shifter.
Figure 12:
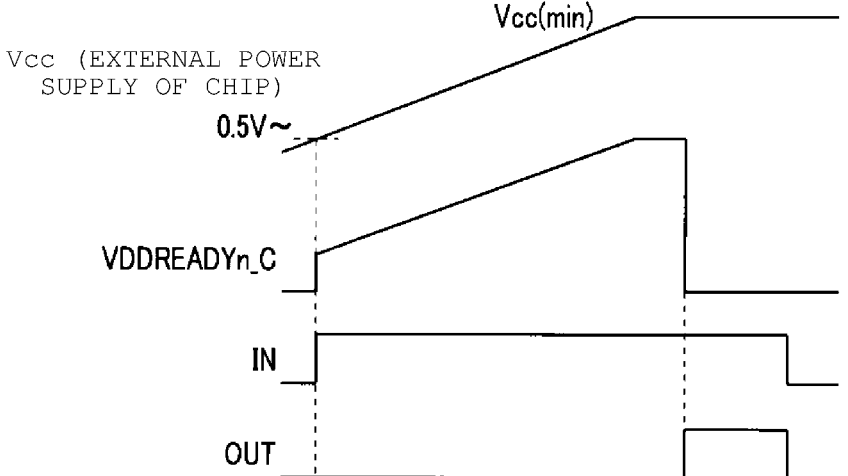
FIG. 12 is a waveform diagram illustrating an output of a level shifter that includes an operation permission signal.

FIG. 10 is a circuit diagram illustrating an example of a circuit including a level shifter and FIG. 11 is a waveform diagram illustrating an operation of the level shifter. FIG. 12 is a waveform diagram illustrating an output of the level shifter that includes the operation permission signal VDDREADYn_C.

The level shifter LS has differential inputs and a single output. In the level shifter LS, differential inputs IN and INB are respectively input to input terminals In1 and In2, and an output signal OUT is output from an output terminal O1. The level shifter LS includes a cross-coupled circuit configured with a differential pair of NMOS transistors T1 and T2 and PMOS transistors T3 and T4, and PMOS transistors T5 and T6.

The in-chip power supply voltage Vsup from the in-chip power generation circuit 40 is supplied to the level shifter LS via a PMOS transistor T7. In the transistor T7, a source is connected to an output end of the in-chip power generation circuit 40, a drain is connected to sources of the transistors T5 and T6, and a gate is supplied with the operation permission signal VDDREADYn_C. The drains of the transistors T5 and T6 are respectively connected to the sources of the transistors T3 and T4. The drain of the transistor T3 is connected to the gate of the transistor T4 and the drain of the transistor T1. The drain of the transistor T4 is connected to the gate of the transistor T3 and the drain of the transistor T2. The sources of the transistors T1 and T2 are connected to the reference voltage point.

The differential input IN with, for example, an operation voltage VDD level is input to the input terminal In1, and the differential input INB with an operation voltage VDD level which is an inversion signal of the differential input IN is input to the input terminal In2. The differential input IN is supplied to the gates of the transistors T1 and T5 and the differential input INB is supplied to the gates of the transistors T2 and T6. The drain of the transistor T2 is connected to the output terminal O1. The output terminal O1 is connected to a drain of an NMOS transistor T8 and a source of the transistor T8 is connected to the reference voltage point. The operation permission signal VDDREADYn_C is applied to the gate of the transistor T8.

FIG. 10 illustrates an example in which the in-chip power supply voltage Vsup of the in-chip power generation circuit 40 is supplied to an analog circuit 71. The analog circuit 71 is supplied with the in-chip power supply voltage Vsup from the in-chip power generation circuit 40 and performs a predetermined operation. That is, here, the in-chip power supply voltage Vsup is set to a voltage for appropriately driving the analog circuit 71. A ground line of the analog circuit 71 is connected to the drain of the transistor T9. The source of the transistor T9 is connected to the reference voltage point and the gate of the transistor T9 is supplied with an output signal OUT from the output terminal O1 of the level shifter LS.

Now, it is assumed that the transistor T7 is turned on and the transistor T8 is turned off. When the differential input IN of the input terminal In1 enters the H level and the differential input INB of the input terminal In2 enters the L level, the transistor T1 is turned on and the transistor T2 is turned off. The transistor T6 is turned on and the transistor T5 is gradually switched from ON to OFF. Here, a connection point of the drain of the transistor T3 and the drain of the transistor T1 enters the L level, and a connection point of the drain of the transistor T4 and the drain of the transistor T2 enters the H level. That is, when the H level is applied to the gate of the transistor T3 and the L level is applied to the gate of the transistor T4, the transistor T3 is turned off and the transistor T4 is turned on, and thus a voltage in the drain of the transistor T4 gradually increases to reach the in-chip power supply voltage Vsup. That is, changes in the differential inputs IN and INB becomes a trigger to operate the cross-coupled circuit in a positive feedback manner, and to increase the output signal OUT up to the in-chip power supply voltage Vsup.

Conversely, when the differential input INB of the input terminal In2 enters the H level and the differential input IN of the input terminal In1 enters the L level, the transistor T1 is turned off and the transistor T2 is turned on. Here, the output terminal OUT enters the L level. The cross-coupled circuit by the transistors T3 and T4 turns off the transistor T4, so that the output terminal OUT is maintained as the L level.

As illustrated in FIG. 11, levels of the differential inputs IN and INB are an operation voltage VDD level. Meanwhile, a level of the output signal OUT is an in-chip power supply voltage Vsup level (for example, 2.2 V, 4 V, or the like) from the in-chip power generation circuit 40. As such, the level shifter LS can perform level shifting on a signal with the operation voltage VDD level to a signal with the in-chip power supply voltage Vsup level.

FIG. 12 illustrates voltage waveforms immediately after power is supplied. As illustrated in FIG. 12, the operation permission signal VDDREADYn_C is set to the H level immediately after power is supplied. That is, when power is supplied, the power supply voltage VCC from outside the chip is raised to reach, for example, 0.5 V, and thus the operation permission signal VDDREADYn_C enters the H level. It is assumed that because of an increase in the power supply voltage VCC, for example, the sequencer 27 starts operation to generate the differential inputs IN and INB or the like. For example, as illustrated in FIG. 12, the differential input IN enters the H level immediately after power is supplied. Here, however, the operation permission signal VDDREADYn_C is also at the H level. Accordingly, the transistor T7 is turned off, the transistor T8 is turned on, and the output signal OUT of the output terminal O1 is maintained at the L level. Accordingly, the transistor T9 is maintained as off and the analog circuit 71 does not start operation.

When the operation permission signal VDDREADYn_C enters the L level, the transistor T7 is turned on, the transistor T8 is turned off, and thus the output signal OUT of the in-chip power supply voltage Vsup is output from the output terminal O1 with a logic according to the differential input IN. When the output signal OUT enters the H level, the transistor T9 is turned on and the analog circuit 71 starts operation.

Use Example of Level Shifter

Figure 13:
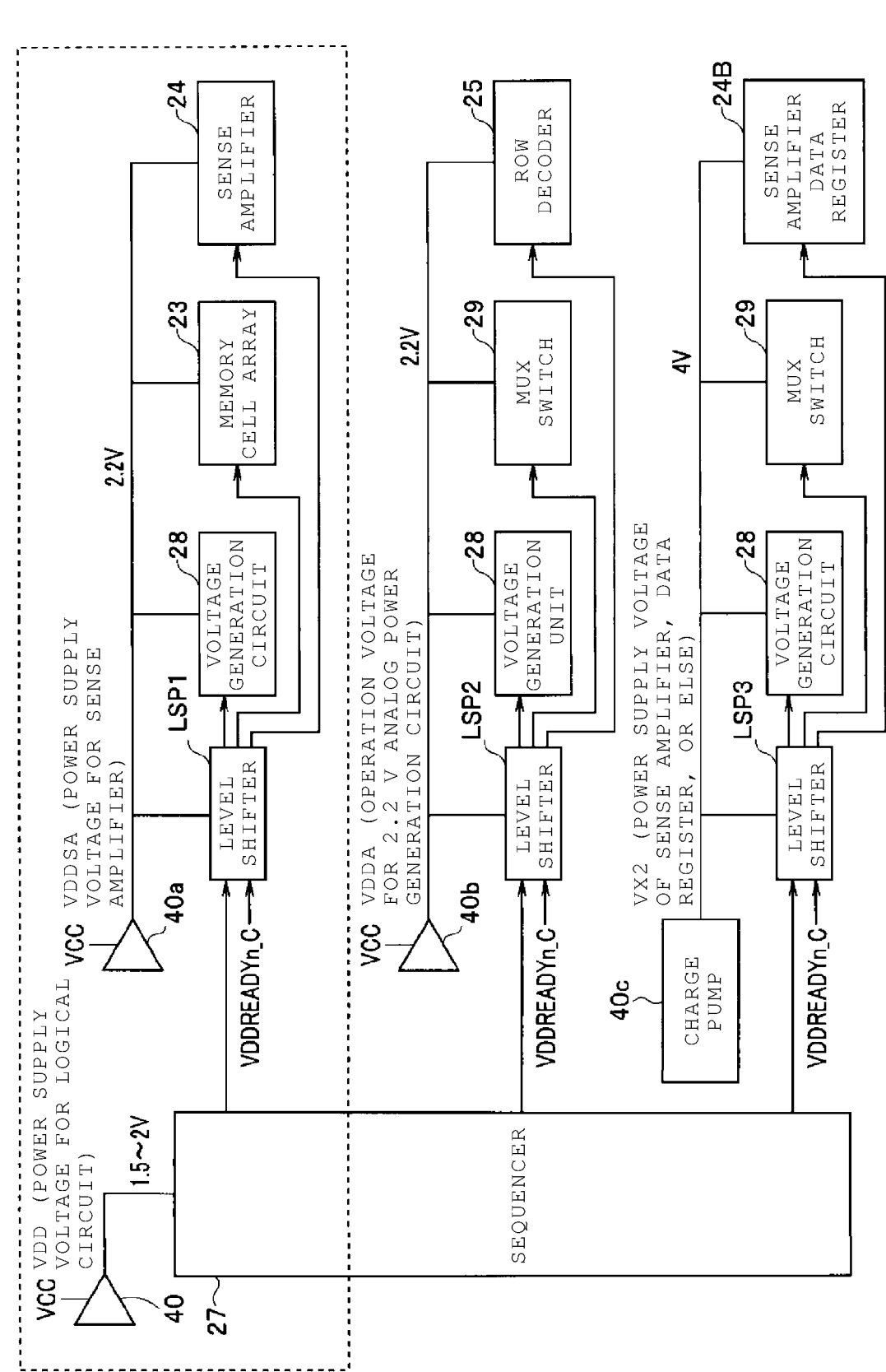
FIG. 13 is a diagram illustrating a usage example of the level shifter.
Figure 14:
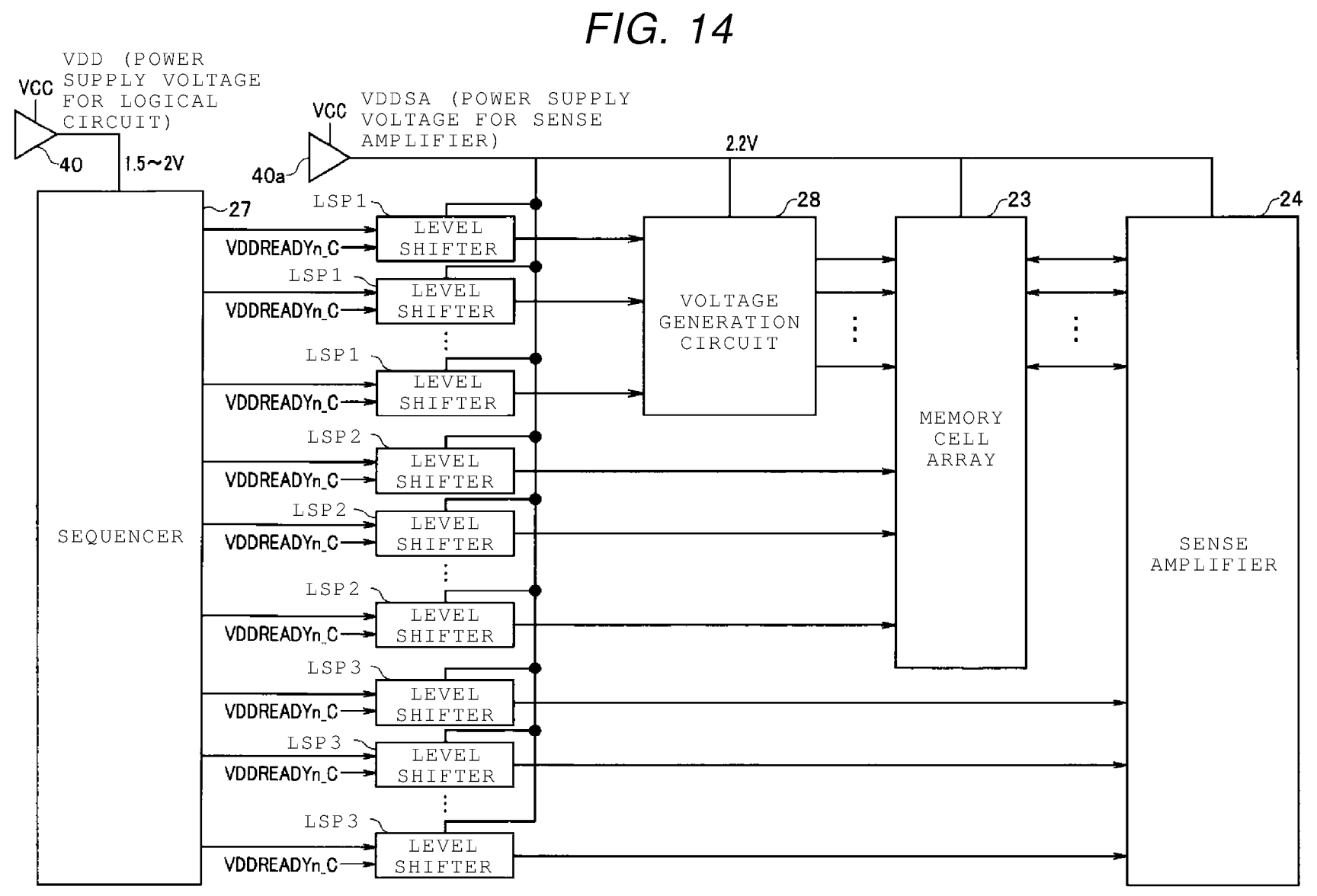

FIGS. 13 and 14 are diagrams illustrating a usage example of the level shifter.

In addition to the row decoder 25, there is a level shifter in which initialization is necessary. For example, an output of the sequencer 27 may be at the operation voltage VDD level of about 1.5 V to 2.0 V. Accordingly, the row decoder 25, the memory cell array 23, the sense amplifier 24, and the like cannot be driven at the operation voltage VDD level in some cases. Accordingly, although not illustrated in FIG. 3 and the like, the output of the sequencer 27 is supplied to the level shifter LS and converted into a voltage level for driving the row decoder 25, the memory cell array 23, the sense amplifier 24, and the like.

FIG. 13 illustrates an example in which the voltage generation circuit 28 of each plane PB is supplied with signals from the sequencer 27 by level shifters LSP1 to LSP3 that have similar configurations as the level shifter LS. FIG. 13 illustrates an example in which, as the in-chip power supply voltage Vsup according to a voltage level to be supplied, an operation voltage VDDSA (for example, 2.2 V) for the sense amplifier is supplied to the level shifter LSP1, the operation voltage VDDA (for example, 2.2 V) for the analog power generation circuit is supplied to the level shifter LSP2, and a power supply voltage VX2 (for example, 4 V) necessary for a sense amplifier or a data register or the like is supplied to the level shifter LSP3.

The operation voltage VDD (for example, 1.5 V to 2.0 V) is supplied from the in-chip power generation circuit 40 to the sequencer 27. Signals with the operation voltage VDD level of the sequencer 27 are output to the level shifters LSP1 to LSP3. A linear regulator 40a of the in-chip power generation circuit 40 generates the operation voltage VDDSA from the power supply voltage VCC and supplies the operation voltage VDDSA to the level shifter LSP1, the voltage generation circuit 28, the memory cell array 23, and the sense amplifier 24. A linear regulator 40b of the in-chip power generation circuit 40 generates the operation voltage VDDA from the power supply voltage VCC and supplies the operation voltage VDDA to the shifter LSP2, the voltage generation circuit 28, the MUX switch 29, and the row decoder 25. A charge pump 40c of the in-chip power generation circuit 40 generates the power supply voltage VX and supplies the power supply voltage VX to the level shifter LSP3, the voltage generation circuit 28, the MUX switch 29, and the data register 24B.

The level shifters LSP1 to LSP3 supply the outputs of the input power supply voltage levels to the voltage generation circuit 28 based on the output of the sequencer 27 during a period in which the operation permission signal VDDREADYn_C is at the L level. When the operation permission signal VDDREADYn_C is at the H level, the outputs of the level shifters LSP1 to LSP3 remain at the L level.

FIG. 13 illustrates one level shifter for each plane PB. Actually, a plurality of level shifters are used. FIG. 14 illustrates examples of the level shifters used for the plane PB including the level shifter LSP1 of FIG. 13.

In the example of FIG. 14, the output of the sequencer 27 is supplied to the voltage generation circuit 28 via the plurality of level shifters LSP1. Similarly, the output of the sequencer 27 is supplied to the memory cell array 23 via the plurality of level shifters LSP2, and outputs of the sequencer 27 are supplied to the sense amplifier 24 via the plurality of level shifters LSP3. The operation voltage VDDSA is supplied from the linear regulator 40a to the level shifters LSP1 to LSP3, the outputs of the sequencer 27 are subjected to the level shifting to the operation voltage VDDSA level, and results are respectively output to the voltage generation circuit 28, the memory cell array 23, or the sense amplifier 24.

The level shifters LSP1 to LSP3 are supplied with the operation permission signal VDDREADYn_C. When the operation permission signal VDDREADYn_C is at the H level, the outputs of the level shifters LSP1 to LSP3 are at the L level. When the operation permission signal VDDREADYn_C at the L level, the level shifters LSP1 to LSP3 output outputs of the operation voltage VDDSA level.

Figure 15:
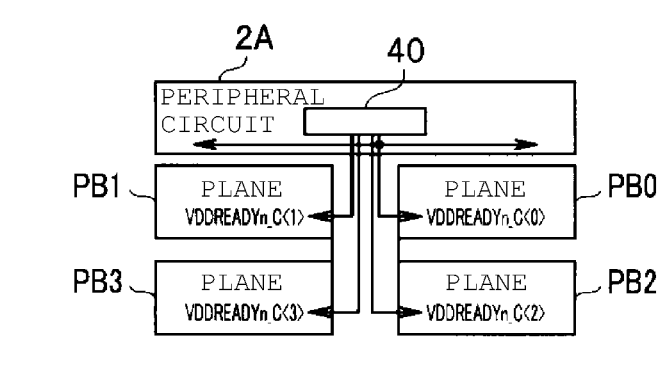
FIG. 15 is a diagram illustrating an operation permission signal supplied to each plane.
Figure 16:
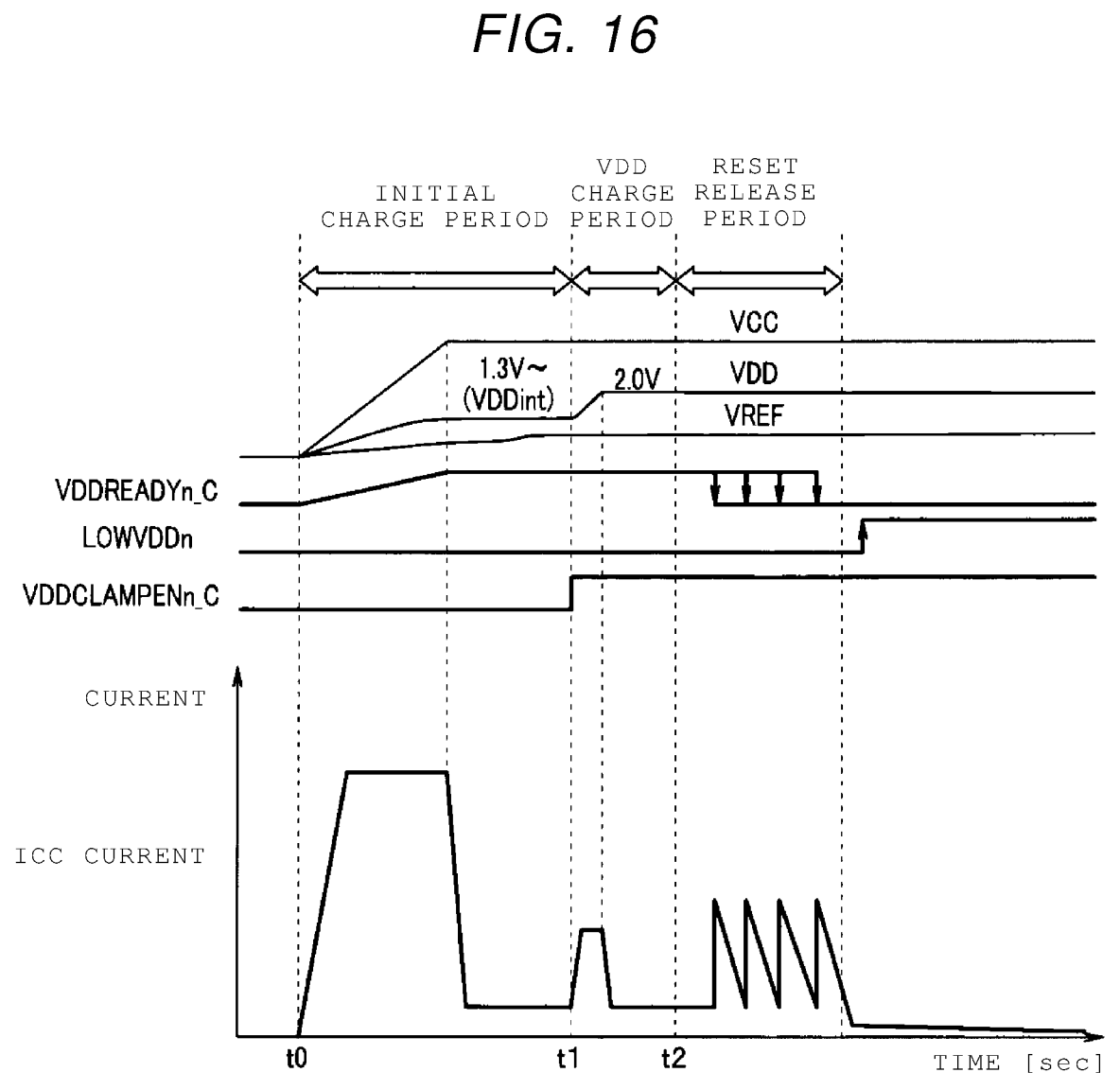

Next, an operation of the embodiment configured as such will be described with reference to FIGS. 15 and 16. FIG. 15 is a diagram illustrating an operation permission signal VDDREADn_C supplied to each plane PB. FIG. 16 is a diagram illustrating a peak of an ICC current according to the embodiment.

FIG. 15 illustrates an example in which the nonvolatile memory 2 is divided into the planes PB0 to PB3 and another peripheral circuit 2A, and the operation permission signal VDDREADYn_C is supplied from the in-chip power generation circuit 40 for each region of the nonvolatile memory 2. For example, the in-chip power generation circuit 40 supplies an operation permission signal VDDREADYn_C<0> to the peripheral circuit 2A and the plane PB0, supplies an operation permission signal VDDREADYn_C<1> to the plane PB1, supplies an operation permission signal VDDREADYn_C<2> to the plane PB2, and supplies an operation permission signal VDDREADYn_C<3> to the plane PB3. The peripheral circuit 2A may be supplied with the operation permission signal VDDREADYn_C of a system different from the plane PB0.

The lower drawing of FIG. 15 illustrates changes in signals of the operation permission signals VDDREADYn_C<0> to VDDREADYn_C<3>, and the low active operation permission signals VDDREADYn_C<0> to VDDREADYn_C<3> do not become active at the same time but are changed actively in sequence.

The upper drawing of FIG. 16 illustrates changes in the power supply voltage VCC, the operation voltage VDD, and the reference voltage VREF in the nonvolatile memory 2, timings at which the operation permission signals VDDREADYn_C<0> to VDDREADYn_C<3> become active, and a change in a signal LOWVDDn indicating that a power-on sequence is completed. The lower drawing of FIG. 16 illustrates a change in the ICC current.

When power is supplied at time t0, the initial charge circuit 41 of the in-chip power generation circuit 40 starts initial charging with the power supply voltage VCC from the power input pad group 35. During an initial charge period illustrated in FIG. 16, the initial operation voltage VDDint from the output end of the initial charge circuit 41 gradually increases to reach, for example, 1.3 V. The initial charge circuit 41 can reduce a peak of the ICC current by one stage by temporarily raising up to the initial operation voltage VDDint without raising the voltage of the VDD supply wiring up to the power supply voltage VDD (2.0 V) of a normal voltage level. The operation permission signal VDDREADYn_C also rises at the initial charging time.

The VREF generation circuit 42 of the in-chip power generation circuit 40 generates the reference voltage VREF using the power supply voltage VCC. The VREF generation circuit 42 supplies the generated reference voltage VREF to the regulator 43. The regulator 43 starts operation at a time t1 at which the timer 44 determines that a time necessary to stabilize both the initial operation voltage VDDint from the initial charge circuit 41 and the reference voltage VREF from the VREF generation circuit 42 at a specified voltage level has elapsed. The regulator 43 generates the operation voltage VDD of 2.0 V during the VDD charge period of FIG. 16.

After time t2 at which the timer 44 determines that a time necessary to complete charging the circuit load with the operation voltage VDD has elapsed, the operation permission signal generation circuit 45 performs reset release. That is, the operation permission signal generation circuit 45 sequentially generates the operation permission signals VDDREADYn_C<0> to VDDREADYn_C<3> illustrated in FIG. 15. In FIG. 16, timings at which the operation permission signals VDDREADYn_C<0> to VDDREADYn_C<3> became low active are indicated by down arrows. That is, first, the logical circuit or the level shifters in the peripheral circuit 2A and the plane PB0 are reset and released according to the operation permission signal VDDREADYn_C<0>. Subsequently, the logical circuit or the level shifters configured in each plane are sequentially reset and released in the order of the planes PB1, PB2, and PB3 according to the operation permission signals VDDREADYn_C<1> to VDDREADYn_C<3>.

Accordingly, as illustrated in FIG. 16, the peak of the ICC current is distributed and a peak current is relatively small. When the reset release ends, the signal LOWVDDn indicating that the power-on sequence ends becomes active ("H").

As such, according to the embodiment, when the power is supplied, the nonvolatile memory 2 is divided into a plurality of regions and the reset release timing can be adjusted for each region, and thus it is possible to reduce the peak current.

Second Embodiment

Figure 17:
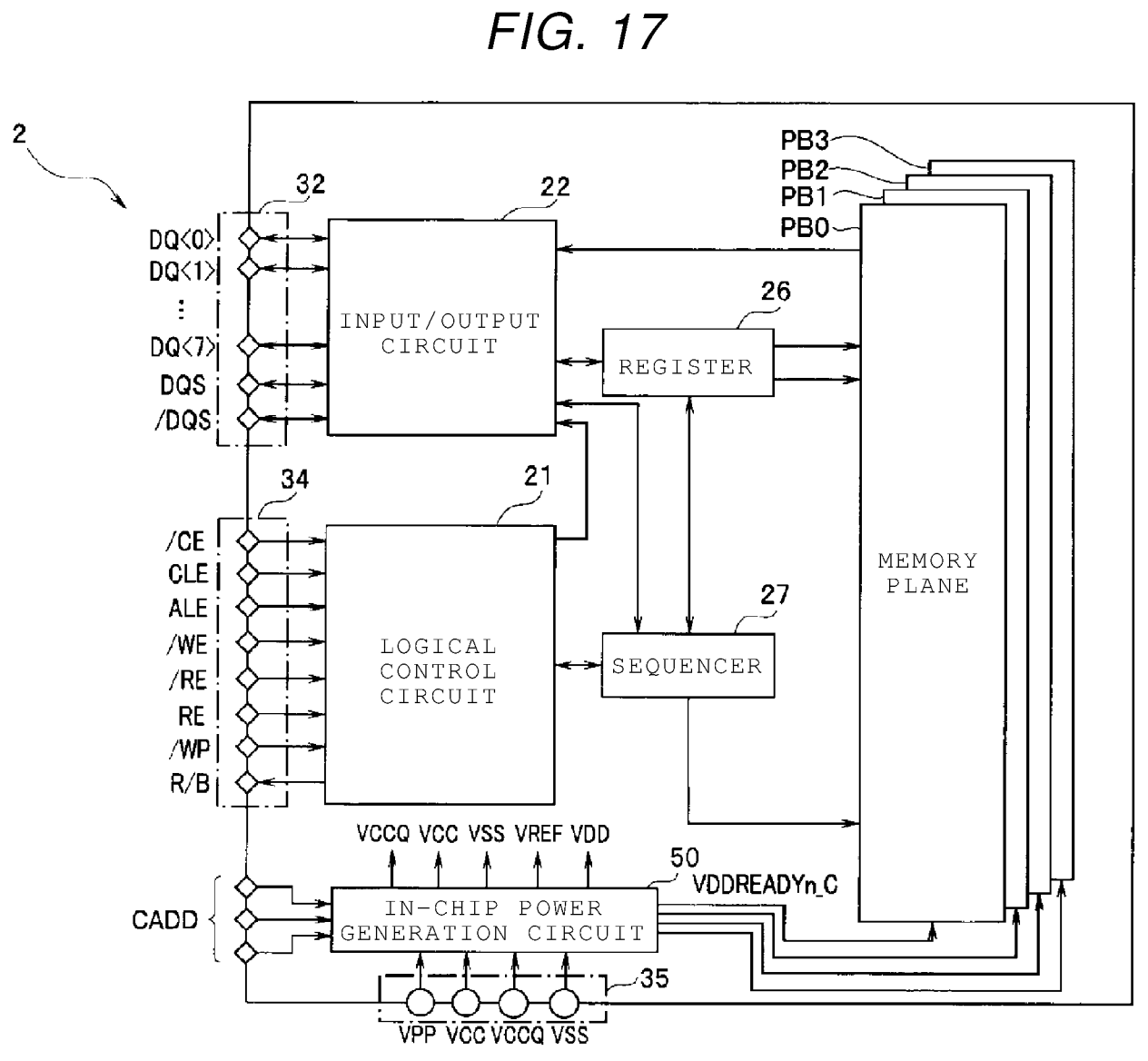
Figure 18:
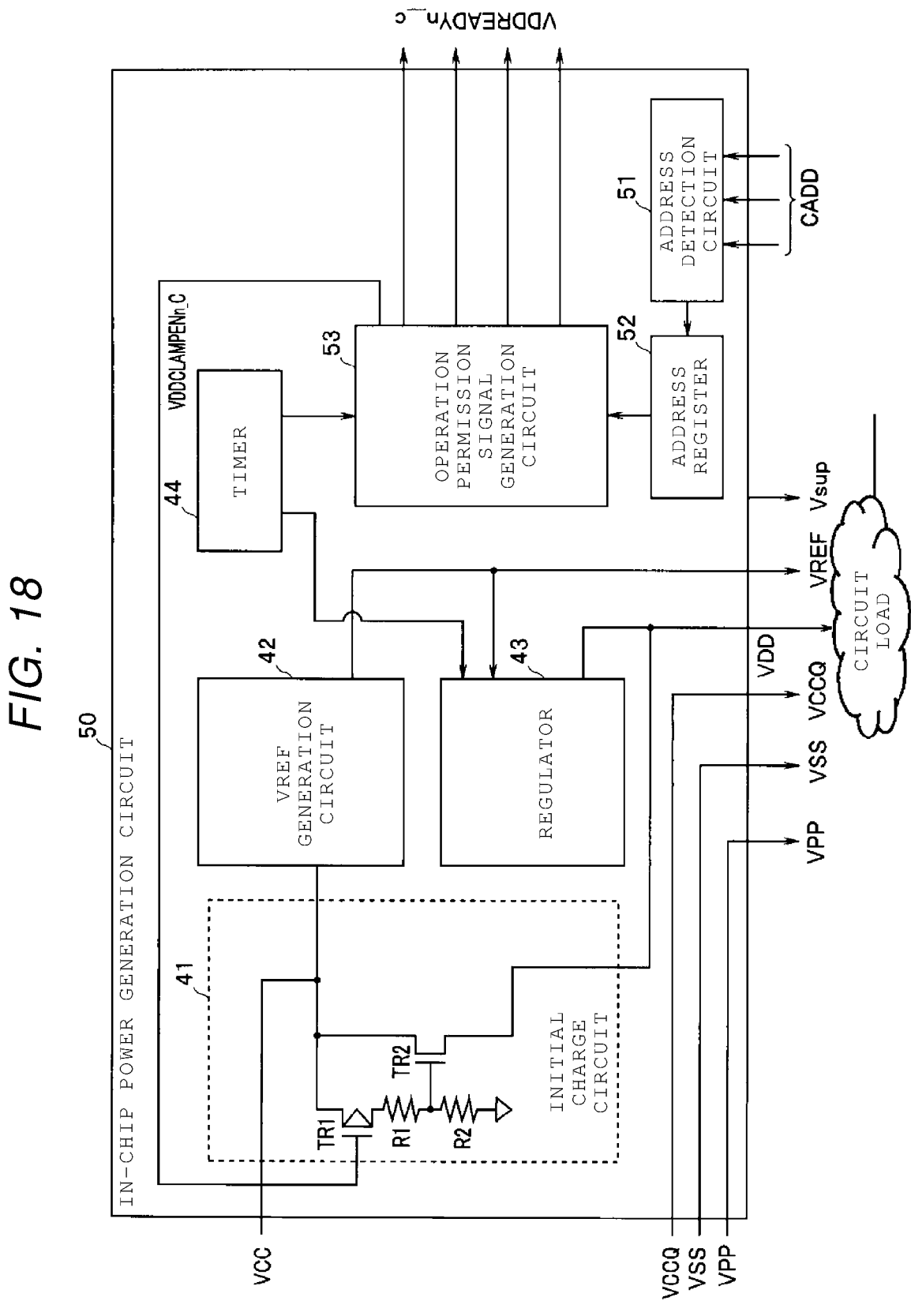
FIG. 18 is a block diagram illustrating an example of a configuration of an in-chip power generation circuit.

FIG. 17 is a block diagram according to a second embodiment. In FIG. 17, the same reference numerals are given to the same elements as those of FIG. 2 and the explanation of the same elements is omitted. FIG. 18 is a block diagram illustrating an example of a configuration of an in-chip power generation circuit 50. In the embodiment, a current peak in the case of a multichip configuration is reduced.

In the nonvolatile memory 2 according to the embodiment, an in-chip power generation circuit 50 is employed instead of the in-chip power generation circuit 40. The in-chip power generation circuit 50 corresponds to multiple chips and, for example, controls a timing at which the operation permission signal VDDREADYn_C is generated for each chip.

A plurality of nonvolatile memory 2 formed as chips (hereinafter referred to as the memory chip 2) are stacked as a package having a multichip configuration. Here, one memory controller 1 controls a plurality of memory chips 2 in the package in some cases. That is, various wirings through which various control signals and power are supplied are shared by the memory chips 2 in the package. That is, in the package, signals ALE, CLE, DQ, DQS, /DQS, /WE, /RE, and RE and the like are shared. A group supplied with such signal lines is also referred to as a channel.

In the package, driving is performed by one or a plurality of chip enable signals /CE. In a group of the memory chips 2 driven with a common chip enable signal /CE, a chip address CADD is used to select each memory chip 2. For example, eight memory chips 2 can be specified with a 3-bit chip address. The memory chip 2 specified with the chip address CADD is referred to as an LUN.

In FIG. 17, the in-chip power generation circuit 50 is supplied with the chip address CADD via a chip address designation pad. As in the in-chip power generation circuit 40, the in-chip power generation circuit 50 generates the operation permission signal VDDREADYn_C at a different timing for each plane PB and outputs the operation permission signal VDDREADYn_C to each region such as the plane PB in the nonvolatile memory 2. In the embodiment, the in-chip power generation circuit 50 generates the operation permission signal VDDREADYn_C at a different timing for each memory chip 2. For such control, the in-chip power generation circuit 50 acquires the chip address CADD from the chip address designation pad.

In FIG. 18, the in-chip power generation circuit 50 is different from the in-chip power generation circuit 40 of FIG. 9 in that an operation permission signal generation circuit 53 is employed instead of the operation permission signal generation circuit 45, and an address detection circuit 51 and an address register 52 are provided. The chip address CADD input via the chip address designation pad of the memory chip 2 is provided to the address detection circuit 51. The address detection circuit 51 detects the chip address CADD of the own chip and provides the detected chip address CADD to the address register 52 to store the chip address CADD. As such, the chip address CADD for specifying the own memory chip 2 is stored in the address register 52.

The operation permission signal generation circuit 53 reads the chip address CADD of the address register 52 when the operation permission signal VDDREADYn_C is generated. The operation permission signal generation circuit 53 outputs the operation permission signal VDDREADYn_C at a different timing for each plane PB during a period corresponding to the read chip address CADD. For example, the operation permission signal generation circuit 53 may cause a period in which the operation permission signal VDDREADYn_C is output based on whether the chip address CADD is an even chip address or an odd chip address. For example, when the read chip address CADD is an even chip address, the operation permission signal generation circuit 53 may output the operation permission signal VDDREADYn_C for each plane PB from a first time immediately after start of the reset release period. When the read chip address CADD is an odd chip address, the operation permission signal generation circuit 53 may output the operation permission signal VDDREADYn_C for each plane PB from a second time after a predetermined delay time passes from the first time.

As such, in the memory chip 2 with the multichip configuration, a period in which the operation permission signal VDDREADYn_C is generated can be set to be different for each memory chip 2. For example, the operation permission signal VDDREADYn_C can be generated in a different period between the memory chip 2 at the even chip address CADD and the memory chip 2 at the odd chip address CADD.

Figure 19:
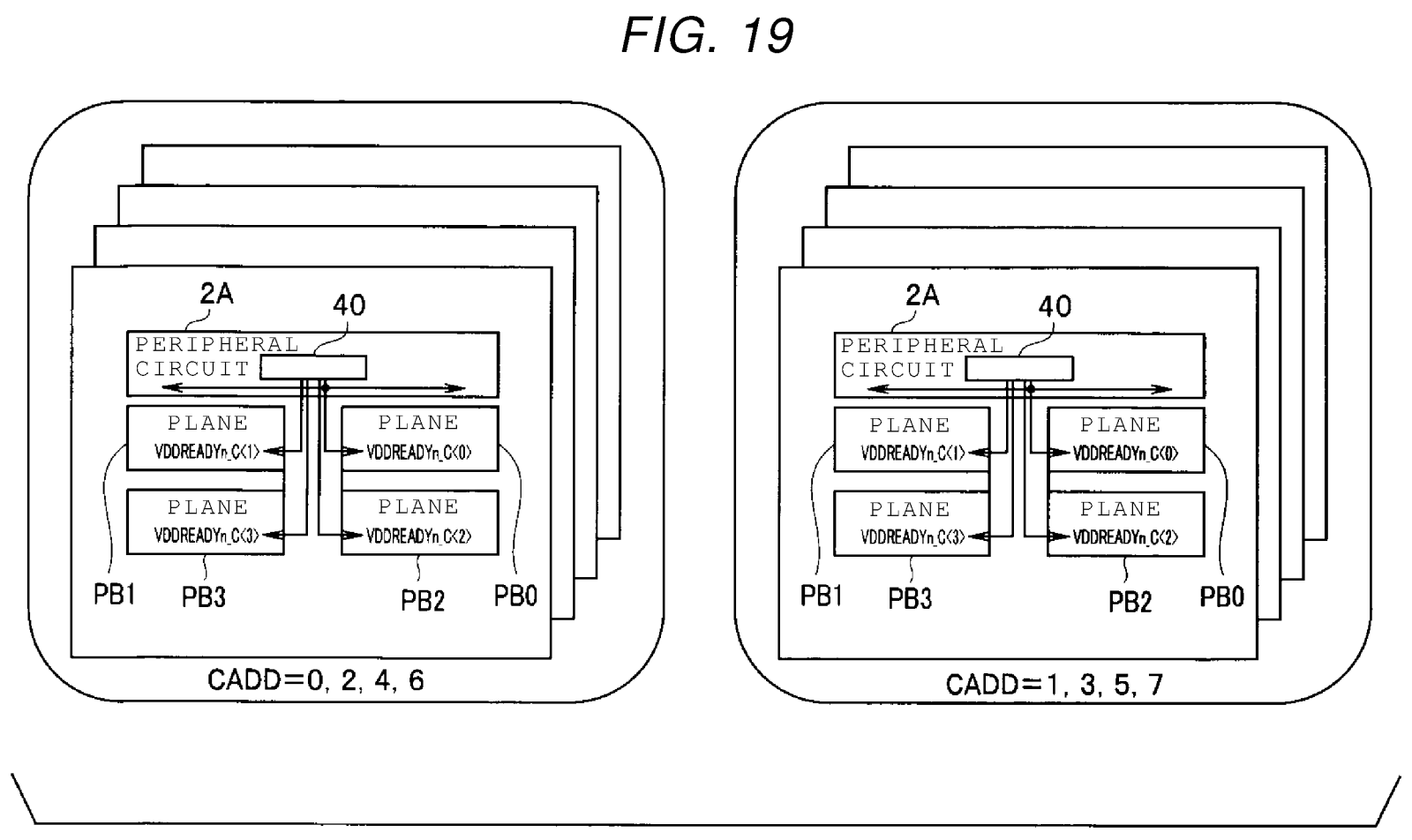
Figure 20:
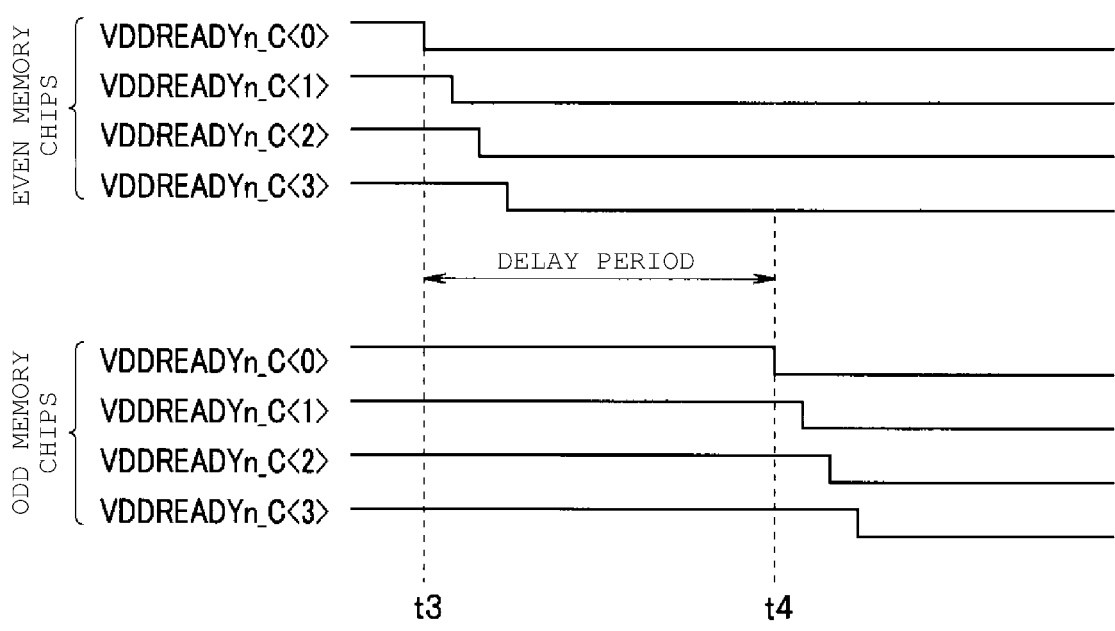
FIG. 20 is a diagram illustrating operation permission signals in each memory chip in which the upper drawing illustrates signals of the first group and the lower drawing illustrates signals of the second group.
Figure 21:
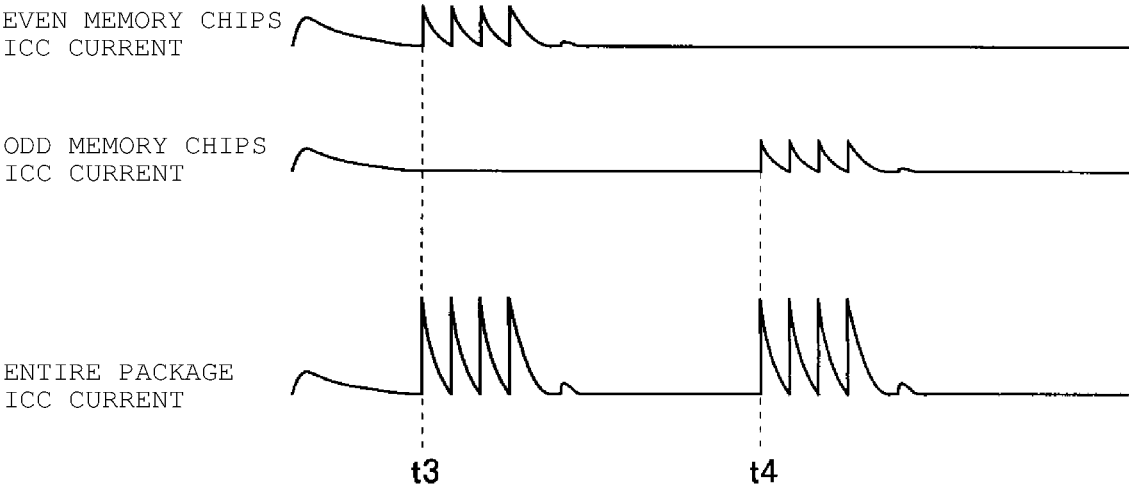
FIG. 21 is a waveform illustrating an ICC current according to the second embodiment.

Next, an operation of the embodiment configured as such will be described with reference to FIGS. 19 to 23. FIG. 19 is a diagram illustrating the first group of the memory chips 2 at even chip addresses (hereinafter referred to as even memory chips 2) and the second group of the memory chips 2 at odd chip addresses (hereinafter referred to as odd memory chips 2). FIG. 20 is a diagram illustrating operation permission signals VDDREADYn_C in each memory chip 2 in which the upper drawing illustrates the first group and the lower drawing illustrates the second group. FIG. 21 is a waveform illustrating an ICC current according to the second embodiment. FIG. 23 is a diagram illustrating a peak of the ICC current according to the second embodiment.

FIGS. 19 to 23 illustrate an example in which the memory chips 2 in the package are divided into the first group at the even chip addresses and the second group at the odd chip addresses, and the operation permission signal VDDREADYn_C is generated in different periods between the first and second groups. As long as a peak of the ICC current in each memory chip 2 in the package is distributed, the grouping of the memory chips 2 in the package is not limited to the first and second group. The memory chips 2 may be divided into three or more groups.

FIG. 19 illustrates an example in which the memory chips 2 are distributed into the memory chips 2 of the first group in which the chip addresses CADD are even chip addresses of CADD=0, 2, 4, and 6 and the memory chips 2 of the second group in which the chip addresses CADD are odd chip addresses of CADD=1, 3, 5, and 7.

In the embodiment, the in-chip power generation circuit 50 also supplies the operation permission signal VDDREADYn_C<0> to the peripheral circuit 2A and the plane PB0, supplies the operation permission signal VDDREADYn_C<1> to the plane PB1, supplies the operation permission signal VDDREADYn_C<2> to the plane PB2, and supplies the operation permission signal VDDREADYn_C<3> to the plane PB3. As illustrated in FIG. 20, the low active operation permission signals VDDREADYn_C<0> to VDDREADYn_C<3> do not become active at the same time and but are changed actively in sequence.

In the embodiment, the in-chip power generation circuit 50 determines whether the own chip belongs to the first or second group according to the chip address CADD read from the address register 52. The in-chip power generation circuit 50 outputs the operation permission signals VDDREADYn_C<0> to VDDREADYn_C<3> at a different timing determined according to whether the own chip belongs to the first or second group.

In such state illustrated in FIG. 20, the operation permission signal generation circuit 53 of the memory chip 2 belonging to the first group of the even chip address sequentially outputs the operation permission signals VDDREADYn_C<0> to VDDREADYn_C<3> from a first time t3. Thereafter, the operation permission signal generation circuit 53 of the memory chip 2 belonging to the second group of the odd chip address sequentially outputs the operation permission signals VDDREADYn_C<0> to VDDREADYn_C<3> from a second time t4.

FIG. 21 illustrates an ICC current in the odd memory chip 2, an ICC current in the even memory chip 2, and an ICC current of the entire package. Since the operation permission signals VDDREADYn_C<0> to VDDREADYn_C<3> are output during different periods between the first and second groups, as illustrated in FIG. 21, a peak of the ICC current due to the reset release in the even memory chip 2 and a peak of the ICC current due to the reset release in the odd memory chip 2 occur at different timings. The peak of the ICC current of the even memory chip 2 and the peak of the ICC current of the odd memory chip 2 are distributed. As a result, the peaks of the ICC currents in the entire package are reduced.

Figure 22:
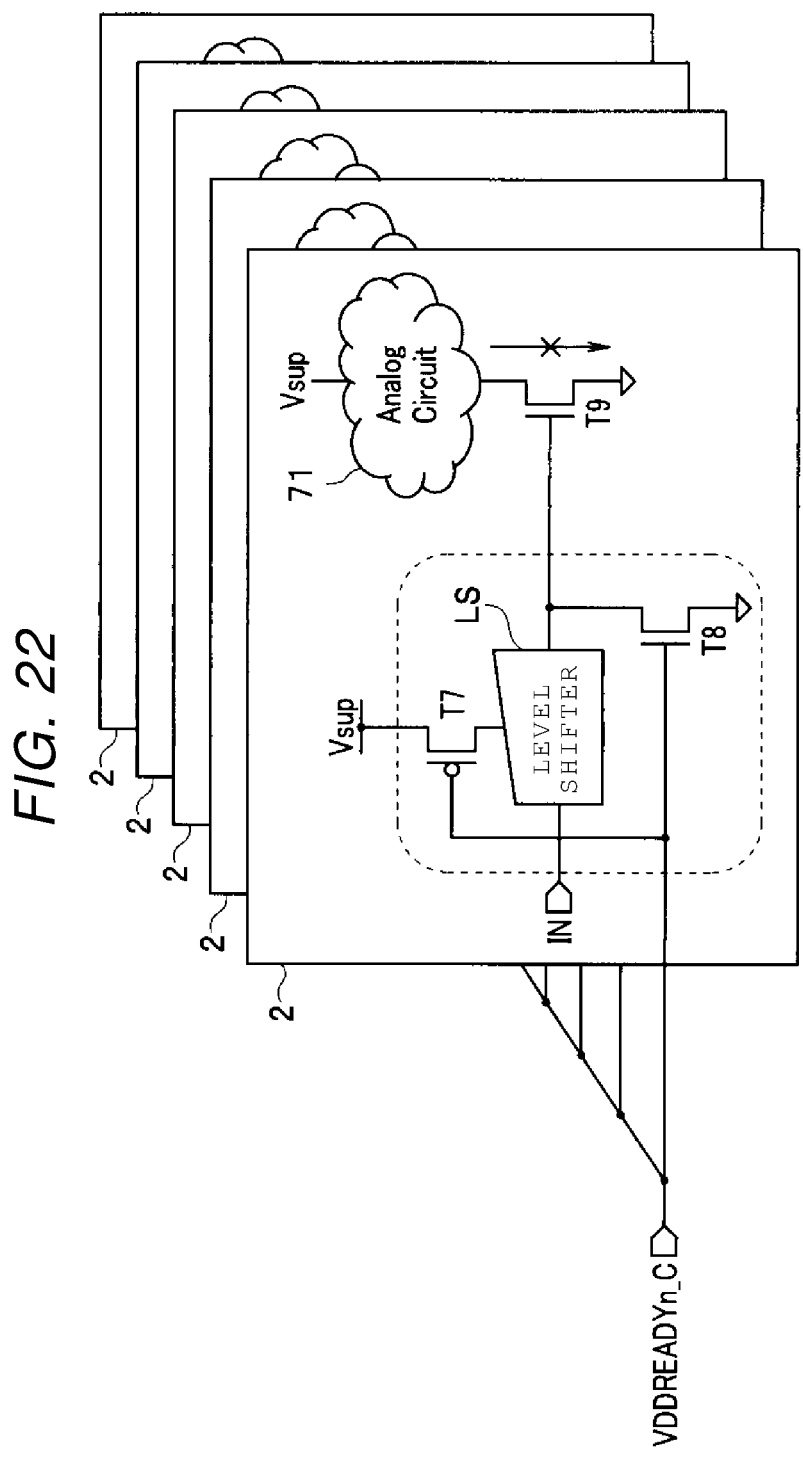
FIG. 22 is a diagram illustrating an example of a level shifter provided in each memory chip.

FIG. 22 is a diagram illustrating an example of a level shifter provided in each memory chip 2. In the example of FIG. 22, a level shifter LS with a similar configuration to that of FIG. 10 is provided in each memory chip 2. Each level shifter LS of each memory chip 2 is supplied with the operation permission signal VDDREADYn_C to control operation.

FIG. 23 illustrates reduction of peaks of the ICC currents according to the second embodiment by a similar notation method to that of FIG. 16.

Operation from power supply at a time t0 until the end of a VDD charge period at a time t2 is similar to the operation of the first embodiment. In the embodiment, at a first time t3 after the end of the VDD charge period, the operation permission signals VDDREADYn_C<0> to VDDREADYn_C<3> are sequentially generated from the operation permission signal generation circuit 53 of the memory chip 2 at the even chip address. Accordingly, the logical circuit or the level shifters in the peripheral circuit 2A and the plane PB0 of each memory chip 2 of the first group having the chip addresses CADD=0, 2, 4, and 6 are reset and released with the operation permission signal VDDREADYn_C<0>. Subsequently, in the order of the planes PB1, PB2, and PB3, the logical circuit or the level shifters configured in each plane are reset and released sequentially with the operation permission signals VDDREADYn_C<1> to VDDREADYn_C<3>.

At a second time t4 after the end of the reset release in each memory chip 2 at the even chip address, the operation permission signals VDDREADYn_C<0> to VDDREADYn_C<3> are sequentially generated from the operation permission signal generation circuit 53 of the memory chips 2 at the odd chip address. Accordingly, the logical circuit or the level shifters in the peripheral circuit 2A and the plane PB0 of each memory chip 2 of the second group having the chip addresses CADD=1, 3, 5, and 7 are reset and released with the operation permission signal VDDREADYn_C<0>. Subsequently, in the order of the planes PB1, PB2, and PB3, the logical circuit or the level shifters configured in each plane are reset and released sequentially with the operation permission signals VDDREADYn_C<1> to VDDREADYn_C<3>.

Accordingly, as illustrated in FIG. 23, the peak of the ICC current in each memory chip 2 is distributed and the peak of the ICC current in the package is distributed into two, and thus it is possible to reduce peak currents in the entire package.

As such, according to the embodiment, it is possible to obtain advantages similar to those of the first embodiment and it is possible to reduce peak currents in the entire package in the multichip configuration.

Modification

Figure 24:
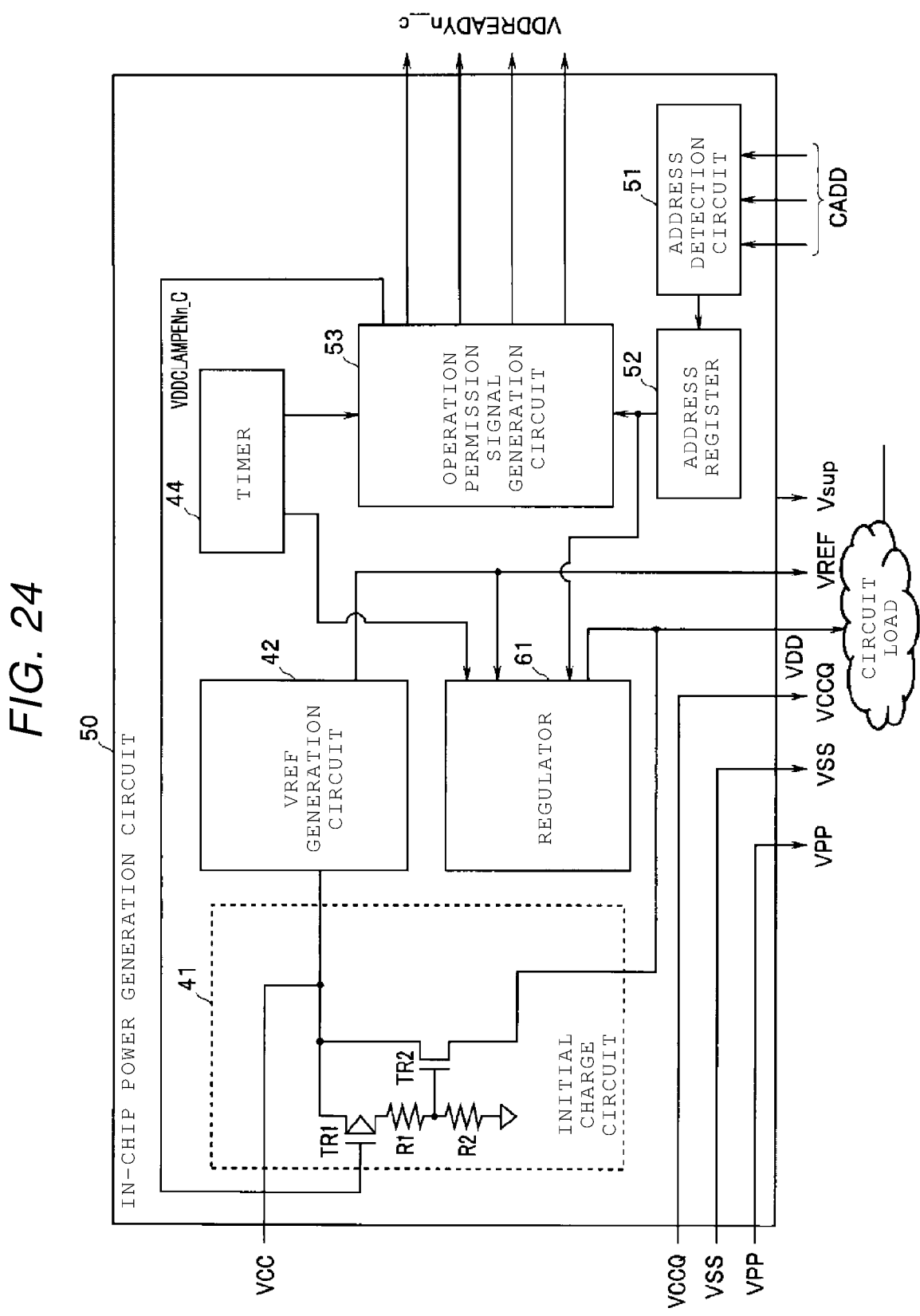
FIG. 24 is a block diagram according to a modification of the embodiments.

FIG. 24 is a block diagram according to a modification. In FIG. 24, the same reference numerals are given to the same elements as those of FIG. 18. In each of the foregoing embodiments, the peaks of the ICC currents are reduced by distributing the reset release timings for each region in the memory chip 2 or each memory chip 2. In the modification, peaks of the ICC currents are reduced by distributing VDD charge timings for each memory chip 2.

The modification is different from the second embodiment in FIG. 17 in that an in-chip power generation circuit 60 is employed instead of the in-chip power generation circuit 50. The in-chip power generation circuit 60 is different from the in-chip power generation circuit 50 of FIG. 18 in that a regulator 61 is employed instead of the regulator 43.

The regulator 61 performs VDD charge using not only time information from the timer 44 but also the chip address CADD from the address register 52. That is, during a period corresponding to the chip address CADD read from the address register 52, the regulator 61 performs VDD charge during a different period for each memory chip 2.

For example, the regulator 61 may cause the VDD charge period to be different based on whether the chip address CADD is an even chip address or an odd chip address. For example, the regulator 61 may start the VDD charge from a third time which is based on time information from the timer 44 when the read chip address CADD is an even chip address. The regulator 61 may start the VDD charge from a fourth time after a predetermined delay time from the third time when the read chip address CADD is an odd chip address.

Figure 25:
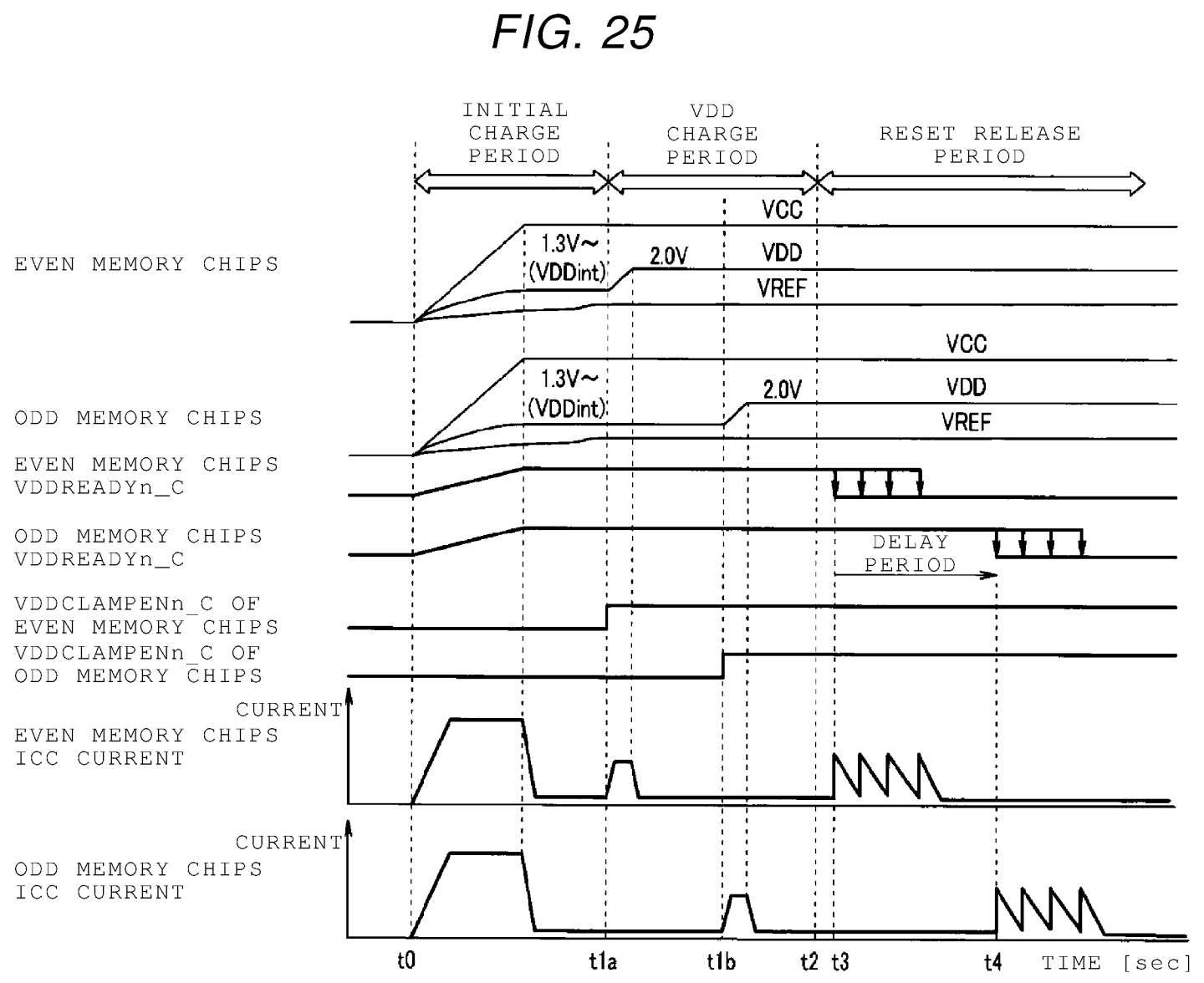

Next, an operation of the modification configured as such will be described with reference to FIG. 25. FIG. 25 is a diagram illustrating a peak of an ICC current according to a modification. FIG. 25 illustrates reduction of peaks of the ICC currents according to the modification by a similar notation method to that of FIG. 23.

Operation from power supply at a time t0 until the start of the VDD charge is similar to the operation of the second embodiment. In the modification, at a start time of the VDD charge period which is based on time information from the timer 44, that is, at a third time t1a, the regulator 61 of the memory chip 2 at the even chip address starts a VDD charge operation. Accordingly, in the even memory chip 2, a VDD supply wiring is an operation voltage VDD at a normal voltage level of about 2.0 V. The regulator 61 of the memory chip 2 at the odd chip address does not start the VDD charge operation at the third time t1a. Accordingly, as illustrated in FIG. 25, the ICC current increases in the even memory chip 2, but the ICC current does not increase in the odd memory chip 2.

At a fourth time t1b after the end of the VDD charge in each memory chip 2 at the even chip address, the regulator 61 of the memory chip 2 at the odd chip address starts the VDD charge operation. Accordingly, in the odd memory chip 2, the VDD supply wiring is the operation voltage VDD at the normal voltage level of about 2.0 V. Accordingly, as illustrated in FIG. 25, the ICC current increases in the odd memory chip 2, but the ICC current does not increase in the even memory chip 2.

Other operations are similar to those of the second embodiment. Accordingly, as illustrated in FIG. 25, the peak of the ICC current caused due to the reset release in each memory chip 2 is distributed and the peak of the ICC current is distributed in the VDD charge operation and the reset release in the package, and thus it is possible to reduce peak currents in the entire package.

As such, according to the embodiment, it is possible to obtain similar advantages to those of the second embodiment and it is possible to reduce peak currents during the VDD charge period.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first region including a level shifter;
a second region including a level shifter;
a power input pad; and
an internal power generation circuit configured to generate an internal power supply voltage using a first power supply voltage supplied through the power input pad and supply the internal power supply voltage to the first and second regions, wherein
the internal power generation circuit separately transmits a first signal to the level shifter of the first region for triggering a start of a first operation of the first region and a second signal to the level shifter of the second region for triggering a start of a second operation of the second region.

2. The semiconductor storage device according to claim 1, wherein the first and second regions are each regions of different planes.

3. The semiconductor storage device according to claim 2, wherein each of the planes is configured with a memory cell array, and a sense amplifier and a row decoder driving the memory cell array.

4. The semiconductor storage device according to claim 1, wherein the internal power generation circuit is configured to transmit the first signal and the second signal such that a period of the first operation and a period of the second operation are different from each other.

5. The semiconductor storage device according to claim 4, wherein the period of the first operation and the period of the second operation do not overlap each other.

6. The semiconductor storage device according to claim 1, wherein the internal power generation circuit is configured to generate the internal power supply voltage of an initial voltage level from the first power supply voltage until a first timing and generate the internal power supply voltage of a normal voltage level until a second timing after the first timing.

7. The semiconductor storage device according to claim 6, wherein the internal power generation circuit is configured to transmit the first and second signals after the second timing.

8. The semiconductor storage device according to claim 1, further comprising:
a chip address designation pad supplied with a chip address, wherein
the internal power generation circuit is configured to adjust a transmission timing of the first and second signals according to the chip address.

9. The semiconductor storage device according to claim 1, wherein
the first region includes
a P-type first transistor connected between the level shifter and the internal power supply voltage, and
an N-type second transistor connected between an output terminal of the level shifter and a ground voltage, and
the first signal is supplied to a gate of the first transistor and a gate of the second transistor.

10. The semiconductor storage device according to claim 1, wherein
the internal power generation circuit includes a timer and is configured to transmit the first and second signals at different times according to an output of the timer.

11. A semiconductor storage device comprising:
a power input pad; and
an internal power generation circuit configured to generate an internal power supply voltage using a first power supply voltage supplied through the power input pad and supply the internal power supply voltage to first and second regions, wherein
the internal power generation circuit includes a timer and is configured to generate a first signal for triggering a start of a first operation and a second signal for triggering a start of a second operation according to an output of the timer, and
the first operation is performed on a first memory plane and the second operation is performed on a second memory plane.

12. The semiconductor storage device according to claim 11, wherein
the first memory plane includes a level shifter configured to output an operation start signal to a circuit of the first memory plane based on the first signal, and
the second memory plane includes a level shifter configured to output an operation start signal to a circuit of the second memory plane based on the second signal.

13. The semiconductor storage device according to claim 12, wherein
each of the first and second memory planes includes a P-type first transistor having a first end connected to the level shifter and a second end connected to the internal power supply voltage, an N-type second transistor having a first end connected to an output terminal of the level shifter and a second end connected to ground, and an N-type third transistor having a gate connected to the output terminal of the level shifter, a first end connected to the circuit of the respective first or second memory plane, and a second end connected to ground, and the first signal is supplied to gates of the first and second transistors of the first memory plane, and the second signal is supplied to gates of the first and second transistors of the second memory plane.

14. The semiconductor storage device according to claim 13, wherein each of the circuit of the first memory plane and the circuit of the second memory plane is one of a voltage generation circuit, a memory cell array, a sense amplifier, and a row decoder.

15. The semiconductor storage device according to claim 11, wherein the internal power generation circuit is config- ured to generate the internal power supply voltage of an initial voltage level from the first power supply voltage until a first timing and generate the internal power supply voltage of a normal voltage level until a second timing after the first timing.

16. The semiconductor storage device according to claim 15, wherein the internal power generation circuit is config- ured to transmit the first and second signals after the second timing.

17. A semiconductor storage device comprising:

one or more first memory chips each including a level shifter;

one or more second memory chips each including a level shifter;

a power input pad; and an internal power generation circuit configured to gener- ate an internal power supply voltage using a first power supply voltage supplied through the power input pad and supply the internal power supply voltage to the first and second memory chips, wherein the internal power generation circuit separately transmits signals for triggering a start of operation in the first and second memory chips.

18. The semiconductor storage device according to claim 17, further comprising:

a chip address designation pad supplied with a chip address, wherein the internal power generation circuit is configured to adjust a transmission timing of the signals according to the chip address.

19. The semiconductor storage device according to claim 18, wherein the first memory chips have even chip addresses and second memory chips have odd chip addresses.

20. The semiconductor storage device according to claim 19, wherein the signals for triggering the start of operation in the first memory chips are transmitted at different times over a first time period and the signals for triggering the start of operation in the second memory chips are transmit- ted at different times over a second time period that does not overlap with the first time period.

\* \* \* \* \*